United States Patent
Yokomori et al.

(10) Patent No.: US 12,374,576 B2
(45) Date of Patent: Jul. 29, 2025

(54) SEMICONDUCTOR MANUFACTURING APPARATUS AND MANUFACTURING METHOD FOR SEMICONDUCTOR DEVICE

(71) Applicant: Fasford Technology Co., Ltd., Minami-Alps (JP)

(72) Inventors: Tsuyoshi Yokomori, Minami-Alps (JP); Tatsuyuki Okubo, Minami-Alps (JP); Yuki Nakui, Minami-Alps (JP); Hiroshi Maki, Minami-Alps (JP); Akira Saito, Minami-Alps (JP); Naoki Okamoto, Minami-Alps (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 0 days.

(21) Appl. No.: 18/082,727

(22) Filed: Dec. 16, 2022

(65) Prior Publication Data

US 2023/0120615 A1   Apr. 20, 2023

Related U.S. Application Data

(62) Division of application No. 16/813,126, filed on Mar. 9, 2020, now Pat. No. 11,569,118.

(30) Foreign Application Priority Data

Mar. 25, 2019   (JP) ................................. 2019-056583

(51) Int. Cl.
*H01L 21/683* (2006.01)

(52) U.S. Cl.
CPC ............... *H01L 21/6836* (2013.01); *H01L 2221/68327* (2013.01)

(58) Field of Classification Search
CPC ..... H01L 21/78–786; H01L 24/71–741; H01L 21/67253–67259;

(Continued)

(56) References Cited

U.S. PATENT DOCUMENTS

2005/0059205 A1   3/2005   Maki et al.
2008/0318346 A1   12/2008   Maki et al.
(Continued)

FOREIGN PATENT DOCUMENTS

JP   2005-117019 A   4/2005
JP   2007-158103 A   6/2007
(Continued)

OTHER PUBLICATIONS

Korean-language Office Action issued in Korean Application No. 10-2021-0175723 dated Feb. 3, 2022 with English translation (28 pages).

(Continued)

*Primary Examiner* — Julio J Maldonado
*Assistant Examiner* — Stanetta D Isaac
(74) *Attorney, Agent, or Firm* — Crowell & Moring LLP

(57) ABSTRACT

A semiconductor manufacturing apparatus includes a thrust-up unit having a plurality of blocks in contact with a dicing tape, a head having a collet absorbing the die and capable of being moved up and down, and a control section controlling the operation of the thrust-up unit and the head. The thrust-up unit can operate each of the plurality of blocks independently. The control section configures the thrust-up sequences of the plurality of blocks in a plurality of steps, and controls the operation of the plurality of blocks on the basis of a time chart recipe capable of setting the height and the speed of the plurality of blocks for each block and in each step.

18 Claims, 31 Drawing Sheets

(58) Field of Classification Search
CPC . H01L 2224/27001; H01L 2224/27334; H01L 2224/45144; H01L 2224/7565; H01L 2224/75901; H01L 2224/83191; H01L 2224/92247; H01L 2221/68327; H01L 2221/68368; H01L 2221/6839; H01L 24/743; H01L 24/27; H01L 24/45; H01L 24/73; H01L 24/83; H01L 24/92; H01L 24/75; B81C 1/00865–00904; B28D 5/0052; B28D 5/00–0047
See application file for complete search history.

(56) References Cited

U.S. PATENT DOCUMENTS

| | | |
|---|---|---|
| 2013/0071220 A1 | 3/2013 | Kuroda |
| 2013/0255889 A1 | 10/2013 | Barmettler et al. |
| 2017/0133259 A1 | 5/2017 | Kwong et al. |
| 2020/0365430 A1 | 11/2020 | Negishi |

FOREIGN PATENT DOCUMENTS

| | | |
|---|---|---|
| JP | 2009-4403 | 1/2009 |
| JP | 2013-214739 A | 10/2013 |
| JP | 2014-154826 A | 8/2014 |
| JP | 2017-224640 A | 12/2017 |
| JP | 2018-120983 A | 8/2018 |
| JP | 2019-29650 A | 2/2019 |
| KR | 10-2009-0113395 A | 11/2009 |
| KR | 10-2017-0029511 A | 3/2017 |

OTHER PUBLICATIONS

Korean-language Office Action issued in Korean Application No. 10-2021-0175723 dated Jul. 11, 2022 with English translation (16 pages).

Japanese-language Office Action issued in Japanese Application No. 2019-056583 dated Feb. 7, 2023 with English translation (14 pages).

Korean-language Office Action issued in Korean Application No. 10-2023-0035782 dated Sep. 7, 2023, with English translation (23 pages).

Japanese-language Office Action issued in Japanese Application No. 2023-075908 dated Jan. 23, 2024 with English translation (17 pages).

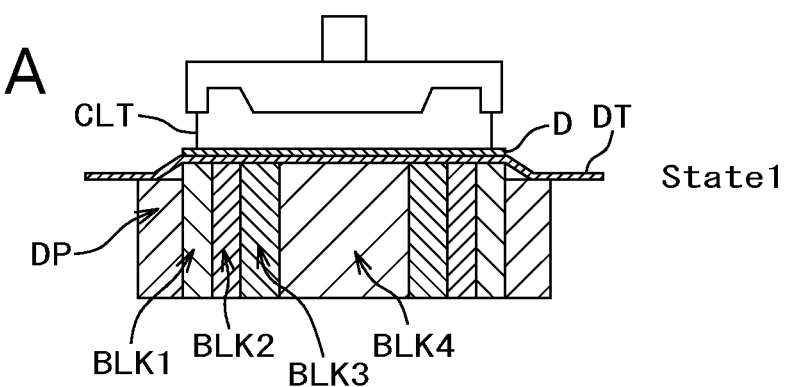
FIG. 3A State1
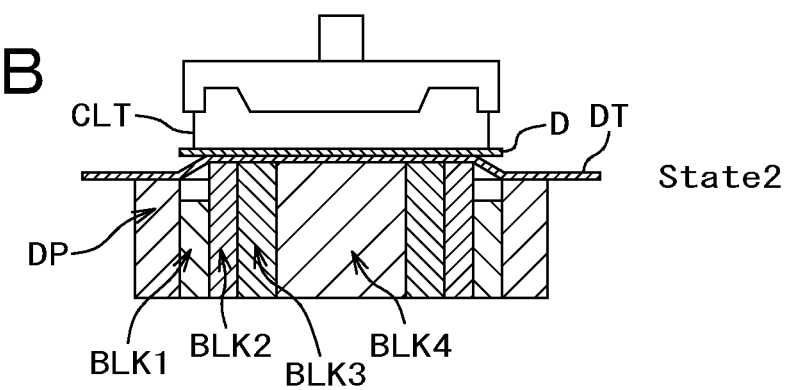
FIG. 3B State2
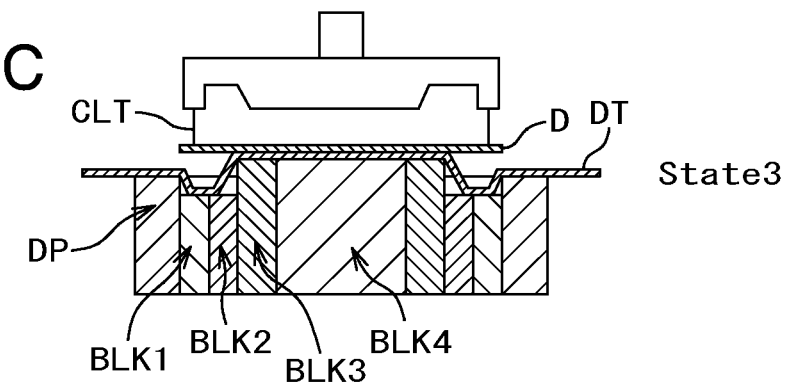
FIG. 3C State3
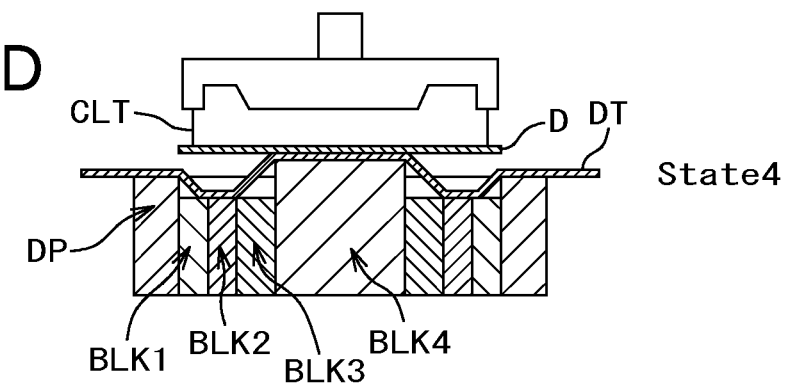
FIG. 3D State4

| STEP | | 1 | 2 | 3 | 4 |
|---|---|---|---|---|---|
| BLK1 | TIME | t1+t2 | t3+t4+t5+t6 | t7 | — |
| NDL4 | SPEED | s1 | s2 | s3 | — |
| | HEIGHT (POSITION) | h1 | -h2 | 0 | — |
| BLK2 | TIME | t1+t2+t3 | t4+t5+t6 | t7 | — |
| NDL3 | SPEED | s1 | s2 | s3 | — |
| | HEIGHT (POSITION) | h1 | -h2 | 0 | — |
| BLK3 | TIME | t1+t2+t3+t4 | t5+t6 | t7 | — |
| NDL2 | SPEED | s1 | s2 | s3 | — |
| | HEIGHT (POSITION) | h1 | -h2 | 0 | — |
| BLK4 | TIME | t1+t2+t3+t4+t5+t6 | t7 | — | — |
| NDL1 | SPEED | s1 | s4 | — | — |
| | HEIGHT (POSITION) | h1 | 0 | — | — |

| | STEP | 1 | 2 | 3 | 4 |
|---|---|---|---|---|---|
| BLK1 | TIME | t1+t2 | t3+t4'+t5'+t6 | t7 | — |
| NDL4 | SPEED | s1 | s2 | s3 | — |
| | HEIGHT (POSITION) | h1 | -h2 | 0 | — |
| BLK2 | TIME | t1+t2+t10 | t3-t10+t4'+t5'+t6 | t7 | — |
| NDL3 | SPEED | s1 | s2 | s3 | — |
| | HEIGHT (POSITION) | h1 | -h2 | 0 | — |
| BLK3 | TIME | t1+t2+t10+t11 | t3+t4'+t5'-t10-t11+t6 | t7 | — |
| NDL2 | SPEED | s1 | s2 | s3 | — |
| | HEIGHT (POSITION) | h1 | -h2 | 0 | — |
| BLK4 | TIME | t1+t2+t3+t4'+t5'+t6 | t7 | — | — |
| NDL1 | SPEED | s1 | s4 | — | — |
| | HEIGHT (POSITION) | h1 | 0 | — | — |

FIG.6

|  | STEP | 1 | 2 | 3 | 4 |
|---|---|---|---|---|---|
| BLK1 | TIME[ms] | 90 | 130 | 30 | — |
| NDL4 | SPEED[mm/s] | 5 | 5 | 5 | — |
|  | HEIGHT(POSITION) [μm] | 200 | -50 | 0 | — |
| BLK2 | TIME[ms] | 100 | 120 | 30 | — |
| NDL3 | SPEED[mm/s] | 5 | 5 | 5 | — |
|  | HEIGHT(POSITION) [μm] | 200 | -50 | 0 | — |
| BLK3 | TIME[ms] | 110 | 110 | 30 | — |
| NDL2 | SPEED[mm/s] | 5 | 5 | 5 | — |
|  | HEIGHT(POSITION) [μm] | 200 | -50 | 0 | — |
| BLK4 | TIME[ms] | 220 | 30 | — | — |
| NDL1 | SPEED[mm/s] | 5 | 5 | — | — |
|  | HEIGHT(POSITION) [μm] | 200 | 0 | — | — |

| | STEP | 1 | 2 | 3 | 4 |
|---|---|---|---|---|---|
| BLK1 POSITION PRIORITY | TIME DIFFERENCE | t2 | t4'+t5'+t6 | t9 | — |
| | SPEED | s1 | s2 | s3 | — |
| | HEIGHT (POSITION) | h1 | -h2 | 0 | — |
| BLK2 POSITION PRIORITY | TIME DIFFERENCE | t2+t10 | t5'+t6 | t9 | — |
| | SPEED | s1 | s2 | s3 | — |
| | HEIGHT (POSITION) | h1 | -h2 | 0 | — |
| BLK3 POSITION PRIORITY | TIME DIFFERENCE | t2+t10+t11 | t6 | t9 | — |
| | SPEED | s1 | s2 | s3 | — |
| | HEIGHT (POSITION) | h1 | -h2 | 0 | — |
| BLK4 POSITION PRIORITY | TIME DIFFERENCE | t2+t3+t4'+t5'+t6 | 0 | — | — |
| | SPEED | s1 | s4 | — | — |
| | HEIGHT (POSITION) | h1 | 0 | — | — |

FIG.8

| | STEP | 1 | 2 | 3 | 4 |
|---|---|---|---|---|---|
| BLK1 POSITION PRIORITY | TIME DIFFERENCE[ms] | 50 | 80 | 20 | |
| | SPEED[mm/s] | 5 | 5 | 5 | |
| | HEIGHT (POSITION) [μm] | 200 | -50 | 0 | |
| BLK2 POSITION PRIORITY | TIME DIFFERENCE[ms] | 60 | 70 | 20 | |
| | SPEED[mm/s] | 5 | 5 | 5 | |
| | HEIGHT (POSITION) [μm] | 200 | -50 | 0 | |
| BLK3 POSITION PRIORITY | TIME DIFFERENCE[ms] | 70 | 60 | 20 | |
| | SPEED[mm/s] | 5 | 5 | 0 | |
| | HEIGHT (POSITION) [μm] | 200 | -5 | | |
| BLK4 POSITION PRIORITY | TIME DIFFERENCE[ms] | 180 | 0 | | |
| | SPEED[mm/s] | 5 | 5 | | |
| | HEIGHT (POSITION) [μm] | 200 | 0 | | |

FIG.9

|  | STEP | 1 | 2 | 3 | 4 |
|---|---|---|---|---|---|
| BLK1 | TIME | | | | |
| | SPEED | | | | |
| | ACCELERATION | | | | |
| | HEIGHT (POSITION) | | | | |
| BLK2 | TIME | | | | |
| | SPEED | | | | |
| | ACCELERATION | | | | |
| | HEIGHT (POSITION) | | | | |
| BLK3 | TIME | | | | |
| | SPEED | | | | |
| | ACCELERATION | | | | |
| | HEIGHT (POSITION) | | | | |
| BLK4 | TIME | | | | |
| | SPEED | | | | |
| | ACCELERATION | | | | |
| | HEIGHT (POSITION) | | | | |

| STEP | | 1 | 2 | 3 | 4 | 5 | 6 | 7 | 8 | 9 | 10 |
|---|---|---|---|---|---|---|---|---|---|---|---|
| BLK1 | TIME [ms] | 10 | 30 | 10 | 50 | 10 | 40 | 10 | 80 | 10 | 10 |
| | SPEED [mm/s] | 5 | 5 | 5 | 5 | 5 | 5 | 5 | 0 | 5 | 5 |
| | ACCELERATION [mm/s$^2$] | 500 | 0 | -500 | 0 | 500 | 0 | -500 | 0 | 500 | -500 |
| | HEIGHT (POSITION) [μm] | 25 | 175 | 200 | 200 | 175 | -25 | -50 | -50 | -25 | 0 |
| BLK2 | TIME [ms] | 10 | 30 | 10 | 60 | 10 | 40 | 10 | 70 | 10 | 10 |
| | SPEED [mm/s] | 5 | 5 | 5 | 5 | 5 | 5 | 5 | 0 | 5 | 5 |
| | ACCELERATION [mm/s$^2$] | 500 | 0 | -500 | 0 | 500 | 0 | -500 | 0 | 500 | -500 |
| | HEIGHT (POSITION) [μm] | 25 | 175 | 200 | 200 | 175 | -25 | -50 | -50 | -25 | 0 |
| BLK3 | TIME [ms] | 10 | 30 | 10 | 70 | 10 | 40 | 10 | 60 | 10 | 10 |
| | SPEED [mm/s] | 5 | 5 | 5 | 5 | 5 | 5 | 5 | 0 | 5 | 5 |
| | ACCELERATION [mm/s$^2$] | 500 | 0 | -500 | 0 | 500 | 0 | -500 | 0 | 500 | -500 |
| | HEIGHT (POSITION) [μm] | 25 | 175 | 200 | 200 | 175 | -25 | -50 | -50 | -25 | 0 |
| BLK4 | TIME [ms] | 10 | 30 | 10 | 180 | 10 | 30 | 10 | | | |
| | SPEED [mm/s] | 5 | 5 | 5 | 5 | 5 | 5 | 5 | | | |
| | ACCELERATION [mm/s$^2$] | 500 | 0 | -500 | 0 | 500 | 0 | -500 | | | |
| | HEIGHT (POSITION) [μm] | 25 | 175 | 200 | 200 | 175 | 25 | 0 | | | |

F I G . 1 1

| | STEP | 1 | 2 | 3 | 4 |
|---|---|---|---|---|---|
| BLK1 POSITION PRIORITY | TIMER TIME | | | | |
| | SPEED | | | | |
| | ACCELERATION | | | | |
| | HEIGHT (POSITION) | | | | |
| BLK2 POSITION PRIORITY | TIMER TIME | | | | |
| | SPEED | | | | |
| | ACCELERATION | | | | |
| | HEIGHT (POSITION) | | | | |
| BLK3 POSITION PRIORITY | TIMER TIME | | | | |
| | SPEED | | | | |
| | ACCELERATION | | | | |
| | HEIGHT (POSITION) | | | | |
| BLK4 POSITION PRIORITY | TIMER TIME | | | | |
| | SPEED | | | | |
| | ACCELERATION | | | | |
| | HEIGHT (POSITION) | | | | |

FIG.12

|  | STEP | 1 | 2 | 3 | 4 |
|---|---|---|---|---|---|
| BLK1 POSITION PRIORITY | REFERENCE TIME | | | | |
| | TIME DIFFERENCE | | | | |
| | SPEED | | | | |
| | HEIGHT (POSITION) | | | | |
| BLK2 POSITION PRIORITY | REFERENCE TIME | | | | |
| | TIME DIFFERENCE | | | | |
| | SPEED | | | | |
| | HEIGHT (POSITION) | | | | |
| BLK3 POSITION PRIORITY | REFERENCE TIME | | | | |
| | TIME DIFFERENCE | | | | |
| | SPEED | | | | |
| | HEIGHT (POSITION) | | | | |
| BLK4 POSITION PRIORITY | REFERENCE TIME | | | | |
| | TIME DIFFERENCE | | | | |
| | SPEED | | | | |
| | HEIGHT (POSITION) | | | | |

FIG. 13

| | STEP | 1 | 2 | 3 | 4 |
|---|---|---|---|---|---|
| BLK1 FUNCTION INPUT | TIME | | | | |
| | SPEED CALCULATION VALUE | | | | |
| | ACCELERATION CALCULATION VALUE | | | | |
| | HEIGHT (POSITION) | | | | |
| BLK2 FUNCTION INPUT | TIME | | | | |
| | SPEED CALCULATION VALUE | | | | |
| | ACCELERATION CALCULATION VALUE | | | | |
| | HEIGHT (POSITION) | | | | |
| BLK3 FUNCTION INPUT | TIME | | | | |
| | SPEED CALCULATION VALUE | | | | |
| | ACCELERATION CALCULATION VALUE | | | | |
| | HEIGHT (POSITION) | | | | |
| BLK4 FUNCTION INPUT | TIME | | | | |
| | SPEED CALCULATION VALUE | | | | |
| | ACCELERATION CALCULATION VALUE | | | | |
| | HEIGHT (POSITION) | | | | |

F I G . 1 5
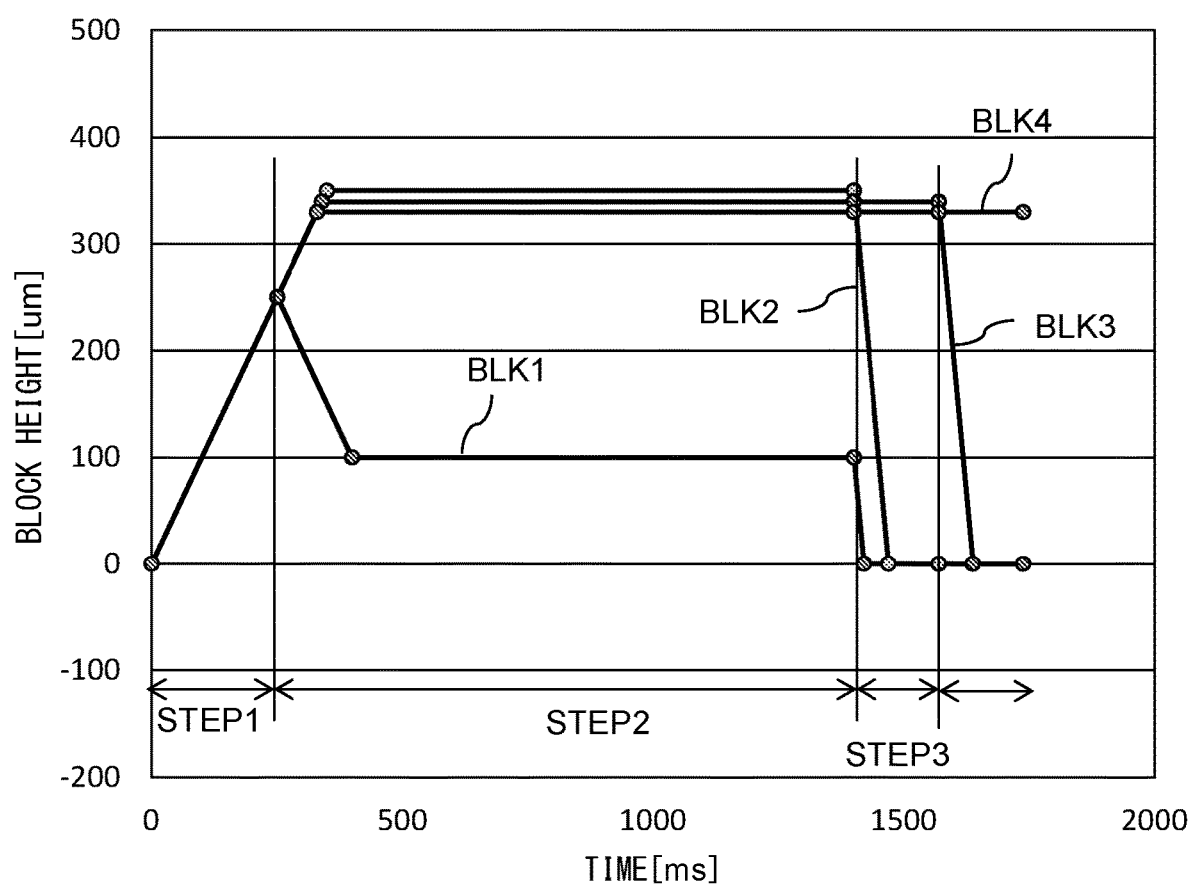

SEMICONDUCTOR MANUFACTURING APPARATUS AND MANUFACTURING METHOD FOR SEMICONDUCTOR DEVICE

CROSS REFERENCE TO RELATED APPLICATIONS

This application is a divisional of U.S. patent application Ser. No. 16/813,126, filed Mar. 9, 2020, which claims priority to Japanese Patent Application No. 2019-056583, filed Mar. 25, 2019, the disclosures of all of which are expressly incorporated by reference herein.

BACKGROUND

This disclosure relates to a semiconductor manufacturing apparatus, and is applicable to, for example, a die bonder including a thrust-up unit.

Typically, the die bonder that mounts a semiconductor chip called a die onto the surface of, for example, a wiring substrate, a lead frame, and the like (hereinafter, collectively referred to as a substrate) repeatedly performs an operation (working) in which typically, the die is conveyed onto the substrate by using an absorption nozzle such as a collet, to apply a pressing force, and a joining material is heated to perform bonding.

The die bonding step by the semiconductor manufacturing apparatus such as the die bonder includes a separation step for separating the die divided from a semiconductor wafer (hereinafter, referred to as a wafer). The separation step thrusts up each die from the back face of a dicing tape by the thrust-up unit, separates the die from the dicing tape held by a die supplying section, and conveys the die onto the substrate by using the absorption nozzle such as the collet.

For example, according to Japanese Unexamined Patent Application Publication No. 2005-117019 (Patent Literature 1), when among a plurality of dies stuck on a dicing tape, the die to be separated is thrusted up and is separated from the dicing tape, an absorption piece (thrust-up unit) pushes up multi stage blocks into pyramid shape by one driving shaft of a pusher, thereby separating the die from the dicing tape at low stress, starting from its periphery.

SUMMARY

In recent years, the appearance of a die stack package and a 3D-NAND (three-dimensional NAND flash) has made the wafer (die) thinner. The thinner die extremely lowers the rigidity of the die, as compared with the tackiness force of the dicing tape. Consequently, to pick up the thin die having, for example, a thickness below several tens of μm, the reduction of the stress applied to the die (lowered stress) is required.

In the above thrust-up of the multi stage blocks by the one driving shaft, the operation order (thrust-up sequences) and the thrust-up amount of each block are limited to be mechanically constant, so that when the conditions such as the type of the dicing tape and the thickness of the die are changed, the operation order and the thrust-up amount of the block is not always optimum.

An object of this disclosure is to provide a semiconductor manufacturing apparatus that can easily change thrust-up sequences.

Other objects and novel features will be apparent from the description herein and the accompanying drawings.

The overview of the representative invention of this disclosure will be briefly described as follows.

That is, a semiconductor manufacturing apparatus includes a thrust-up unit having a plurality of blocks in contact with a dicing tape, a head having a collet absorbing the die and capable of being moved up and down, and a control section controlling the operation of the thrust-up unit and the head. The thrust-up unit can operate each of the plurality of blocks independently. The control section configures the thrust-up sequences of the plurality of blocks in a plurality of steps, and controls the operation of the plurality of blocks on the basis of a time chart recipe capable of setting the height and the speed of the plurality of blocks for each block and in each step.

According to the semiconductor manufacturing apparatus, the thrust-up sequences can be easily changed.

BRIEF DESCRIPTION OF THE DRAWINGS

FIGS. 3A to 3D are diagrams illustrating an example of the thrust-up sequences of RMS;

FIG. 6 is a diagram illustrating the numerical value example of the first time chart recipe of FIGS. 5A and 5B;

FIG. 8 is a diagram illustrating the numerical value example of the second time chart recipe of FIGS. 7A and 7B;

FIG. 9 is a diagram of assistance in explaining a third time chart recipe;

FIG. 11 is a diagram of assistance in explaining a fourth time chart recipe;

FIG. 12 is a diagram of assistance in explaining a fifth time chart recipe;

FIG. 13 is a diagram of assistance in explaining a sixth time chart recipe;

FIG. 15 is a diagram illustrating the block operation timing of the thrust-up sequences of the first operation example;

DESCRIPTION OF THE PREFERRED EMBODIMENTS

Figure 1:
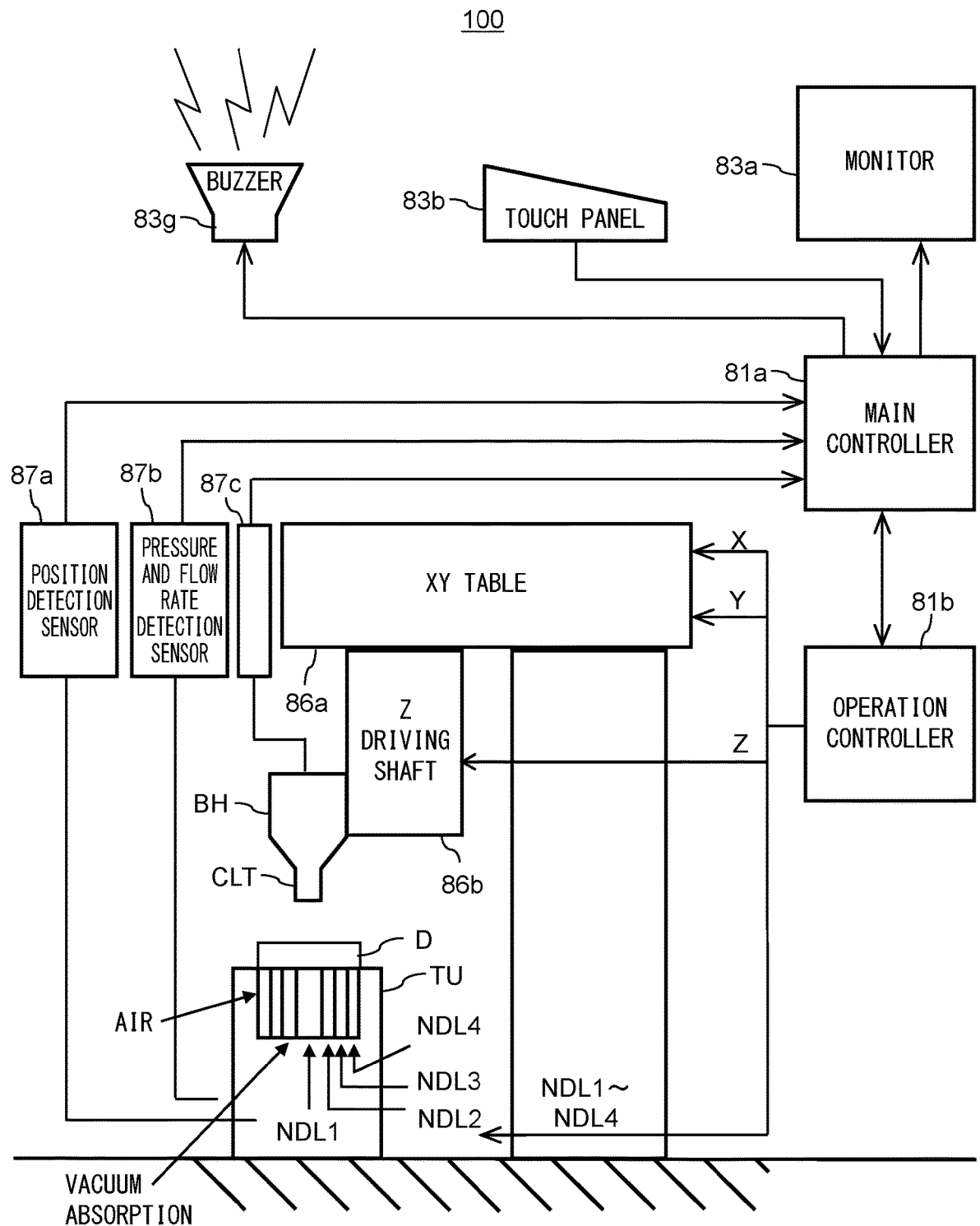
FIG. 1 is a schematic diagram illustrating the configuration of a semiconductor manufacturing apparatus of an embodiment.

Hereinafter, an embodiment and an example will be described with reference to the drawings. However, in the following description, the same components are indicated by the same reference numerals, and the repeated description thereof is sometimes omitted. It should be noted that to make the description more clearly, the width, the thickness, the shape, and the like of each portion can be schematically represented in the drawings, as compared with the actual form, but such representation is an example only, and does not limit the understanding of the present invention.

Embodiment

First, a semiconductor manufacturing apparatus according to an embodiment will be described with reference to FIG. 1. FIG. 1 is a schematic diagram illustrating the configuration of the semiconductor manufacturing apparatus according to the embodiment.

A semiconductor manufacturing apparatus 100 according to the embodiment includes a control section having a main controller 81a, an operation controller 81b, a monitor 83a, a touch panel 83b, and a buzzer 83g. The semiconductor manufacturing apparatus 100 further includes an XY table 86a, a Z driving section 86b, and a thrust-up unit TU that are controlled by the operation controller 81b. The semiconductor manufacturing apparatus 100 further includes a head (bonding head or pick-up head) BH moved up and down by the Z driving section 86b, and a collet CLT provided at the end of the head BH. The semiconductor manufacturing apparatus 100 further includes a sensor 87a detecting the position of the thrust-up unit TU, a sensor 87b detecting a pressure and a flow rate, and a sensor 87c detecting the gas flow rate of the collet CLT. The thrust-up unit TU includes a function of vacuum absorbing a dicing tape, and a function of blowing up air to the dicing tape.

Figure 2:
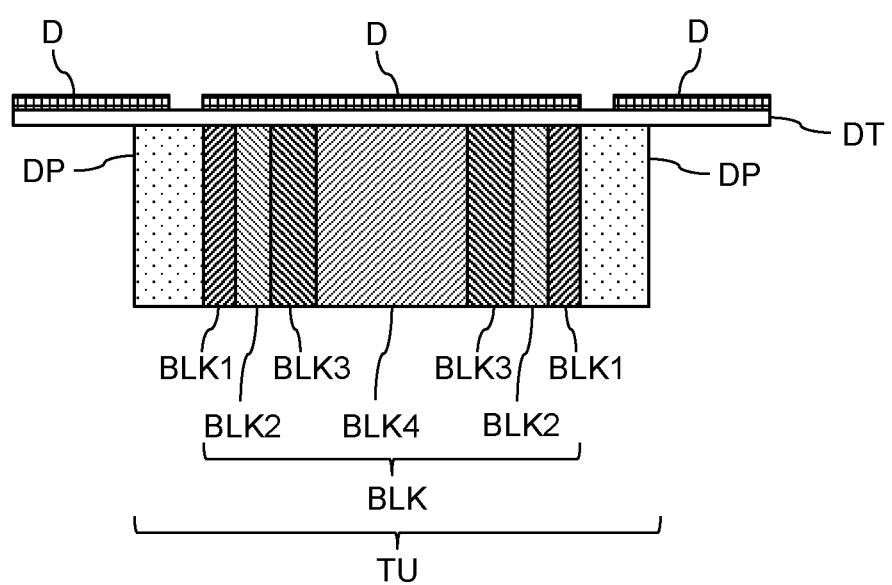
FIG. 2 is an essential part cross-sectional view of a thrust-up unit in the state of being in contact with a dicing tape.

Next, the thrust-up unit TU having multi stage thrust-up blocks will be described with reference to FIG. 2. FIG. 2 is an essential part cross-sectional view of the thrust-up unit in the state of being in contact with the dicing tape.

The thrust-up unit TU has a block BLK having blocks BLK1 to BLK4, and a dome plate DP having a plurality of suction holes (not illustrated) absorbing a dicing tape DT. The four blocks BLK1 to BLK4 can be moved up and down independently by needles NDL4 to NDL1, respectively. The planar shape of the blocks BLK1 to BLK4 in concentric square shape is matched with the shape of a die D.

For example, the thrust-up unit TU thrusts up the blocks BLK1 to BLK4 at the same time, and then, further thrusts up the blocks BLK2 to BLK4 at the same time, and then, further thrusts up the blocks BLK3 and BLK4 at the same time, and then, further thrusts up the block BLK4, thereby making them into pyramid shape, or thrusts up the blocks BLK1 to BLK4 at the same time, and lowers each of them in the order of the block BLK1, the block BLK2, and the block BLK3. The latter is referred to as RMS (Reverse Multi Step) in this disclosure.

Figures 4A, 4B:
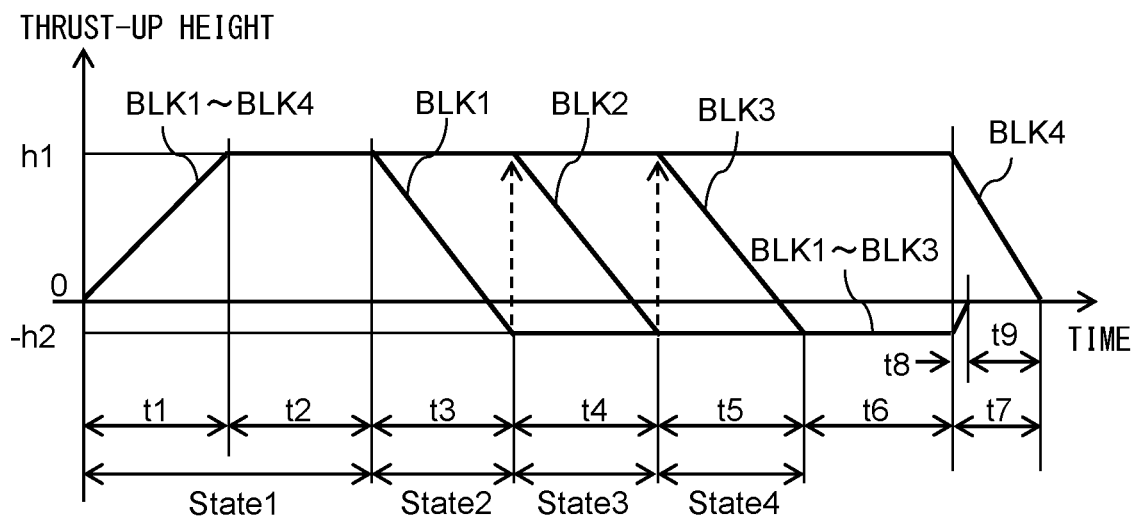
FIGS. 4A and 4B are diagrams of assistance in explaining an example of a first time chart recipe of the sequences of FIGS. 3A to 3D.

The operation of the RMS will be described with reference to FIGS. 3A to 3D and FIGS. 4A and 4B. FIGS. 3A to 3D are cross-sectional views illustrating an example of the thrust-up sequences of the RMS, FIG. 3A is a diagram illustrating a first state, FIG. 3B is a diagram illustrating a second state, FIG. 3C is a diagram illustrating a third state, and FIG. 3D is a diagram illustrating a fourth state. FIGS. 4A and 4B are diagrams of assistance in explaining an example of a first time chart recipe of the sequences of FIGS. 3A to 3D, FIG. 4A is a diagram illustrating an example of the block operation timing of the sequences of FIGS. 3A to 3D, and FIG. 4B is a diagram illustrating an example of the time chart recipe corresponding to the block operation timing of FIG. 4A.

The pick-up operation is started with the positioning of the targeted die D on the dicing tape DT to the thrust-up unit TU and the collet CLT. When the positioning is completed, vacuumizing is performed through the suction holes and the gaps, not illustrated, of the thrust-up unit TU, so that the dicing tape DT is absorbed onto the upper face of the thrust-up unit TU. At this time, the upper faces of the blocks BLK1 to BLK4 are at the same height as the upper face of the dome plate DP (initial position). In that state, vacuum is supplied from a vacuum supply source, and the collet CLT is lowered toward the device face of the die D while performing vacuumizing, and is landed onto it.

Thereafter, as illustrated in FIG. 3A, the blocks BLK1 to BLK4 are lifted to a predetermined height (h1) at the same time at a constant speed (s1) to be in the first state (State 1). Here, as illustrated in FIG. 4A, when time at which the blocks BLK1 to BLK4 reach the h1 is t1, t1=h1/s1. Thereafter, the operation of the RMS waits for a predetermined time (t2). The die D is lifted while being sandwiched between the collet CLT and the blocks BLK1 to BLK4, but the peripheral portion of the dicing tape DT remains vacuum-absorbed onto the dome plate DP that is the periphery of the thrust-up unit TU, so that a tension occurs in the periphery of the die D, and as a result, the separation of the dicing tape DT is started in the periphery of the die D.

Subsequently, as illustrated in FIG. 3B, the block BLK1 is lowered to a predetermined height (−h2) lower than the upper face of the dome plate DP at a constant speed (s2) to be in the second state (State 2). Here, as illustrated in FIG. 4A, when time at which the block BLK1 reaches the predetermined height (−h2) is t3, t3=(h1+h2)/s2. The block BLK1 is lowered with respect to the upper face of the dome plate DP, the support of the dicing tape DT disappears, and the separation of the dicing tape DT is advanced by the tension of the dicing tape DT.

Subsequently, as illustrated in FIG. 3C, the block BLK2 is lowered to the predetermined height (−h2) lower than the upper face of the dome plate DP at the constant speed (s2) to be in the third state (State 3). Here, as illustrated in FIG. 4A, when time at which the block BLK2 reaches the predetermined height (−h2) is t4, t4=(h1+h2)/s2. The block BLK2 is lowered with respect to the upper face of the dome plate DP, the support of the dicing tape DT disappears, and the separation of the dicing tape DT is further advanced by the tension of the dicing tape DT.

Subsequently, as illustrated in FIG. 3D, the block BLK3 is lowered to the predetermined height (−h2) lower than the upper face of the dome plate DP at the constant speed (s2) to be in the fourth state (State 4). Here, as illustrated in FIG. 4A, when time at which the block BLK3 reaches the predetermined height (−h2) is t5, t5=(h1+h2)/s2. The block BLK3 is lowered with respect to the upper face of the dome plate DP, the support of the dicing tape DT disappears, and the separation of the dicing tape DT is further advanced by the tension of the dicing tape DT.

Thereafter, the collet CLT is pulled upward. Also, as illustrated in FIG. 4A, the blocks BLK1 to BLK3 are lifted at a constant speed (s3) after a predetermined time (t6) from the fourth state, and the block BLK4 is lowered at a constant speed (s4) to be returned to the initial position. Here, when time at which the blocks BLK1 to BLK3 reach the initial position is t8, t8=h2/s3, and when time at which the block BLK4 reaches the initial position is t9, t9=h1/s4. With this, the operation of separating the die D from the dicing tape DT is completed.

Next, the setting method and the control of the operation of the RMS will be described with reference to FIGS. 4A and 4B.

As illustrated in FIG. 4B, the operation of the respective blocks BLK1, BLK2, BLK3, and BLK4 of the thrust-up unit TU is configured so that the main controller 81a and the operation controller 81b control the needles NDL4, NDL3, NDL2, and NDL1 driving the respective blocks BLK1, BLK2, BLK3, and BLK4, respectively, on the basis of the first time chart recipe setting the step time, the block lifting or lowering speed, and the block height (position) for each block and in each step.

A plurality of time chart recipes having different setting items are prepared, the user selects one of the plurality of time chart recipes by GUI (Graphical User Interface), and inputs a set value to the item of the selected time chart recipe. Alternatively, the user performs data communication for the time chart recipe to which the set value is previously inputted, from external equipment to the semiconductor manufacturing apparatus such as a die bonder, or installs the time chart recipe from an external memory device (for example, a magnetic tape, a magnetic disk such as a flexible disk and a hard disk, an optical disk such as a CD and a DVD, a magneto-optical disk such as an MO, and a semiconductor memory such as a USB memory and a memory card) to the semiconductor manufacturing apparatus. Also, the main controller 81a can rewrite the time chart recipe in real time on the basis of the state detected by the sensors 87a, 87b, 87c, and the like to instruct the operation controller 81b to change the thrust-up operation.

First Time Chart Recipe

The operation on the basis of the first time chart recipe of FIG. 4B will be described in detail.

(1) Block BLK1

Time in the first step (STEP1) is (t1+t2), and the operation controller 81b lifts the block BLK1 from the beginning of the first step to the height of the h1 at the speed of the s1 to maintain the state at the height of the h1. The first step (STEP1) of the block BLK1 corresponds to the first state of FIG. 3A.

Time in the second step (STEP2) is (t3+t4+t5+t6), and the operation controller 81b lowers the block BLK1 from the beginning of the second step to the height of the −h2 at the speed of the s2 to maintain the state at the height of the −h2. The second step (STEP2) of the block BLK1 corresponds to the second state to the fourth state of FIG. 3B.

Time in the third step (STEP3) is t7, and the operation controller 81b lifts the block BLK1 from the beginning of the third step to the initial position (the height of 0) at the speed of the s3.

(2) Block BLK2

Time in the first step (STEP1) is (t1+t2+t3), and the operation controller 81b lifts the block BLK2 from the beginning of the first step to the height of the h1 at the speed of the s1 to maintain the state at the height of the h1. The first step (STEP1) of the block BLK2 corresponds to the first state of FIG. 3A and the second state of FIG. 3B.

Time in the second step (STEP2) is (t4+t5+t6), and the operation controller 81b lowers the block BLK2 from the beginning of the second step to the height of the −h2 at the speed of the s2 to maintain the state at the height of the −h2. The second step (STEP2) of the block BLK2 corresponds to the third state of FIG. 3C and the fourth state of FIG. 3D.

Time in the third step (STEP3) is the t7, and the operation controller 81b lifts the block BLK2 from the beginning of the third step to the initial position (the height of 0) at the speed of the s3.

(3) Block BLK3

Time in the first step (STEP1) is (t1+t2+t3+4), and the operation controller 81b lifts the block BLK3 from the beginning of the first step to the height of the h1 at the speed of the s1 to maintain the state at the height of the h1. The first step (STEP1) of the block BLK3 corresponds to the first state of FIG. 3A, the second state of FIG. 3B, and the third state of FIG. 3C.

Time in the second step (STEP2) is (t5+t6), as illustrated in FIG. 4B, and the operation controller 81b lowers the block BLK3 from the beginning of the second step to the height of the −h2 at the speed of the s2 to maintain the state at the height of the −h2. The second step (STEP2) of the block BLK3 corresponds to the fourth state of FIG. 3D.

Time in the third step (STEP3) is the t7, and the operation controller 81b lifts the block BLK3 from the beginning of the third step to the initial position (the height of 0) at the speed of the s3.

(4) Block BLK4

Time in the first step (STEP1) is (t1+t2+t3+t4+t5+t6) as illustrated in FIG. 4B, and the operation controller 81b lifts the block BLK4 from the beginning of the first step to the height of the h1 at the speed of the s1 set in the first time chart recipe of FIG. 4B to maintain the state at the height of the h1. The first step (STEP1) of the block BLK4 corresponds to the first state of FIG. 3A, the second state of FIG. 3B, the third state of FIG. 3C, and the fourth state of FIG. 3D.

Time in the second step (STEP2) is the t7, and the operation controller 81b lowers the block BLK4 from the beginning of the second step to the initial position (the height of 0) at the speed of the s4.

The Different Operation Timing Example of the First Time Chart Recipe

Figures 5A, 5B:
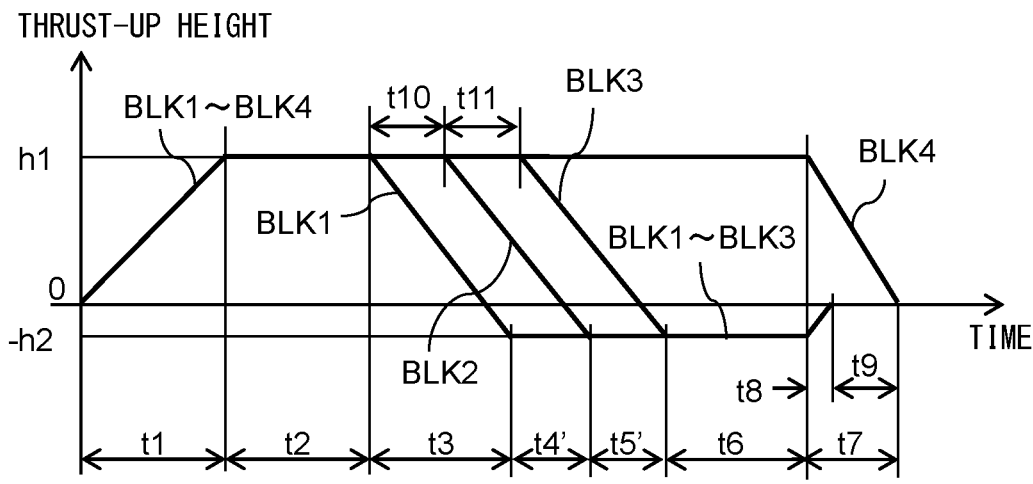
FIGS. 5A and 5B are diagrams of assistance in explaining another example of the first time chart recipe of the sequences of FIGS. 3A to 3D.

Another example of the block operation timing of the sequences of FIGS. 3A to 3D will be described with reference to FIGS. 5A, 5B, and 6. FIGS. 5A and 5B are diagrams of assistance in explaining another example of the first time chart recipe of the sequences of FIGS. 3A to 3D, FIG. 5A is a diagram illustrating another example of the block operation timing of the sequences of FIGS. 3A to 3D, and FIG. 5B is a diagram illustrating an example of the time chart recipe corresponding to the block operation timing of FIG. 5A. FIG. 6 is a diagram illustrating the numerical value example of the time chart recipe of FIG. 5B.

In the block operation timing of FIG. 4A, the lowering operation of the block BLK2 is started after the lowering operation of the block BLK1, and the lowering operation of the block BLK3 is started after the lowering operation of the block BLK2, whereas in the block operation timing of FIG. 5A, the lowering operation of the block BLK2 is started during the lowering operation of the block BLK1, and the lowering operation of the block BLK3 is started during the lowering operation of the block BLK2. The first time chart recipe of FIG. 5B is the same as the first time chart recipe of FIG. 4B except that time set to the "time" of the first time chart recipe of FIG. 5B is shorter than time set to the "time" of the first time chart recipe of FIG. 4B.

The difference between the time chart recipe of FIG. 5B and the time chart recipe of FIG. 4B will be described.

(1) Block BLK1

The set value of the first time chart recipe of FIG. 5B with respect to the block BLK1 is the same as the set value of the first time chart recipe of FIG. 4B with respect to the block BLK1 except for the second step (STEP2). Time of (t3+t4'+t5'+t6) of the second step (STEP2) of FIG. 5B is shorter than time of (t3+t4+t5+t6) of the second step (STEP2) of FIG. 4B. Here, t4'<t4, and t5'<t5.

(2) Block BLK2

The set value of the first time chart recipe of FIG. 5B with respect to the block BLK2 is the same as the set value of the first time chart recipe of FIG. 4B with respect to the block BLK2 except for the first step (STEP1) and the second step (STEP2).

Time in the first step (STEP1) is (t1+t2+t10), as illustrated in FIG. 5B, and is shorter than (t1+t2+t3) of FIG. 4B. Here, t10<t3.

Time in the second step (STEP2) is (t3−t10+t4'+t5'+t6) as illustrated in FIG. 5B, and is shorter than (t4+t5+t6) of FIG. 4B. Here, t3−t10+t4'=t4, and t5'<t5.

(3) Block BLK3

The set value of the first time chart recipe of FIG. 5B with respect to the block BLK3 is the same as the set value of the first time chart recipe of FIG. 4B with respect to the block BLK3 except for the first step (STEP1) and the second step (STEP2).

Time in the first step (STEP1) is (t1+t2+t10+t11), as illustrated in FIG. 5B, and is shorter than (t1+t2+t3+t4) of FIG. 4B. Here, t10<t3, and t11<t4.

Time in the second step (STEP2) is (t3+t4'+t5'−t10−t11+t6) as illustrated in FIG. 5B, and is the same as (t5+t6) of FIG. 4B. Here, t5=(t3+t4'+t5'−t10−t11).

(4) Block BLK4

The set value of the first time chart recipe of FIG. 5B with respect to the block BLK4 is the same as the set value of the first time chart recipe of FIG. 4B with respect to the block BLK4 except for the first step (STEP1).

Time in the first step (STEP1) is (t1+t2+t3+t4'+t5'+t6) as illustrated in FIG. 5B, and is shorter than (t1+t2+t3+t4+t5+t6) of FIG. 4B. Here, t4'<t4, t5'<t5.

FIG. 6 illustrates an example in which in FIG. 5B, t1=40 ms, t2=50 ms, t3=50 ms, t4'=t5'=10 ms, t6=60 ms, t7=30 ms, t10=t11=10 ms, s1=s2=s3=s4=5 mm/s, h1=200 μm, and −h2=−50 μm.

Second Time Chart Recipe

The block operation timing of FIG. 5A can also be set in another time chart recipe (a second time chart recipe). The second time chart recipe will be described with reference to FIGS. 7A, 7B, and 8.

Figures 7A, 7B:
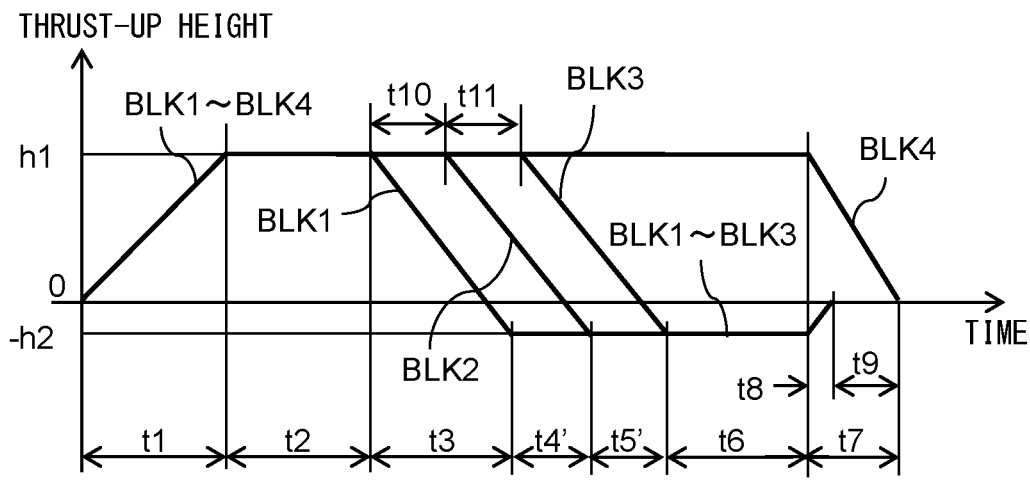
FIGS. 7A and 7B are diagrams of assistance in explaining an example of a second time chart recipe of the sequences of FIGS. 3A to 3D.

FIGS. 7A and 7B are diagrams of assistance in explaining an example of the second time chart recipe of the sequences of FIGS. 3A to 3D, FIG. 7A is a diagram illustrating the same block operation timing as FIG. 5A, and FIG. 7B is a diagram illustrating an example of the second time chart recipe corresponding to the block operation timing of FIG. 5A. FIG. 8 is a diagram illustrating the numerical value example of the time chart recipe of FIG. 7B.

As illustrated in FIG. 7B, instead of the time of the first time chart recipe of FIG. 4B, the second time chart recipe ends each step by giving priority to the reaching to the block position where the operation of each block is instructed, and inputs an operation time difference (time difference or interval time) for the adjustment of the processing time between the respective blocks to execute the operation of each block. In other words, the time difference is the time from the completion of the lifting or lowering of each block to the start of the next step. With this, each block is reliably operated in each step, and then, can be operated by the synchronization with other blocks.

In the first time chart recipe, the length of each step is set on the basis of time, but in the second time chart recipe, the length of each step is set on the basis of time from the completion of the lifting or lowering of the block in each step to the start of the lifting or lowering of the block in the next step (hereinafter, referred to as a time difference or interval time). The "speed" and the "height (position)" in the second time chart recipe are the same as the first time chart recipe.

The "time difference" set to the second time chart recipe of FIG. 7B will be described.

(1) Block BLK1

As illustrated in FIG. 7B, the set value of the "time difference" of the second time chart recipe of FIG. 7B with respect to the block BLK1 is the t2 in the first step (STEP1), (t4'+t5'+t6) in the second step (STEP2), and the t9 in the third step (STEP3).

(2) Block BLK2

As illustrated in FIG. 7B, the set value of the "time difference" of the second time chart recipe of FIG. 7B with respect to the block BLK2 is (t2+t10) in the first step (STEP1), (t5'+t6) in the second step (STEP2), and the t9 in the third step (STEP3).

(3) Block BLK3

As illustrated in FIG. 7B, the set value of the "time difference" of the second time chart recipe of FIG. 7B with respect to the block BLK2 is (t2+t10+t11) in the first step (STEP1), the t6 in the second step (STEP2), and the t9 in the third step (STEP3).

(4) Block BLK4

As illustrated in FIG. 7B, the set value of the "time difference" of the second time chart recipe of FIG. 7B with respect to the block BLK2 is (t2+t3+t4'+t5'+t6) in the first step (STEP1), and 0 in the second step (STEP2).

FIG. 8 illustrates an example in which in FIG. 7B, t2=50 ms, t3=50 ms, t4'=t5'=10 ms, t6=60 ms, t9=20 ms, t10=t11=10 ms, s1=s2=s3=s4=5 mm/s, h1=200 μm, and −h2=−50 μm.

Third Time Chart Recipe

Figures 10A, 10B:
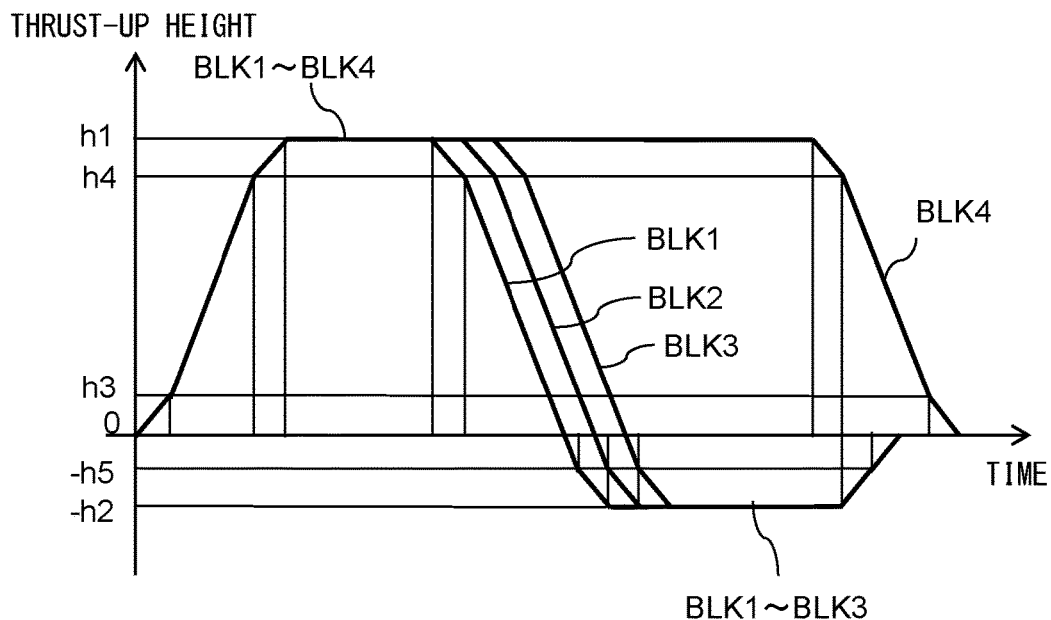
FIGS. 10A and 10B are diagrams of assistance in explaining an example of the third time chart recipe of FIG. 9.

A further example of the time chart recipe will be described with reference to FIGS. 9, 10A, and 10B. FIG. 9 is a diagram illustrating a third time chart recipe. FIGS. 10A and 10B are diagrams of assistance in explaining an example of the third time chart recipe of FIG. 9, FIG. 10A is a diagram illustrating the numerical value example of the third time chart recipe of FIG. 9, and FIG. 10B is a diagram illustrating an example of a block operation timing corresponding to the third time chart recipe of FIG. 10A.

As illustrated in FIG. 9, the third time chart recipe has, in addition to the item of the first time chart recipe of FIG. 4B, the item of the acceleration for each block. When the numerical values as illustrated in FIG. 10A are set, the block operation timing as illustrated in FIG. 10B is provided. Here, h1=200 μm, −h2=−50 μm, h3=25 μm, h4=175 μm, and −h5=−25 μm. With this, the non-linear operation of changing the lifting speed of the respective blocks BLK1 to BLK4 is enabled.

Other Time Chart Recipes

Other examples of the time chart recipe will be described with reference to FIGS. 11 to 13. FIG. 11 is a diagram illustrating a fourth time chart recipe. FIG. 12 is a diagram illustrating a fifth time chart recipe. FIG. 13 is a diagram illustrating a sixth time chart recipe. The example in which the number of steps (STEPs) of the time chart recipe is 4 is illustrated, but the number of steps is not limited to 4, and may be less than 4, and 5 or more.

As illustrated in FIG. 11, the fourth time chart recipe has the item of acceleration like the third time chart recipe, ends each step by giving priority to the reaching to the instructed block position (height), and goes to the next step. With this, even when there is an individual difference of the operation speed and the like, the moving to other operation is enabled at the timing at which the block operation is reliably completed. Also, as illustrated in FIG. 11, the fourth time chart recipe has the item of a waiting time (timer time) after the completion of the operation for the synchronization with other thrust-up blocks. Also, like the third time chart recipe, the non-linear operation of, for example, changing the lifting speed is enabled.

As illustrated in FIG. 12, the fifth time chart recipe is provided with the reference time of each step, in addition to the operation setting items of the second time chart recipe, ends each step by giving priority to the reaching to the block position where the operation of each block is instructed, and inputs the operation time difference for the adjustment of the processing time between the respective blocks to execute the operation of each block. With this, each block is reliably operated in each step, and then, can also be operated by the synchronization with other blocks, and the non-linear operation of, for example, changing the lifting speed is enabled.

As illustrated in FIG. 13, the sixth time chart recipe has the items of a speed calculation value and an acceleration calculation value in place of the items of the speed and the acceleration of the third time chart recipe, inputs a function for calculating the speed, the acceleration, the operation time (time), and the height (position), and performs the operation according to an input value from the calculation result. With this, the more complex non-linear operation can be performed.

As described above, by the setting of the time chart recipe, the operation of the respective blocks BLK1 to BLK4 of the thrust-up unit TU can be freely set in the thrust-up operation step, and the thrust-up unit TU enables various operations. Its operation examples will be described below.

First Operation Example

Figure 14A:
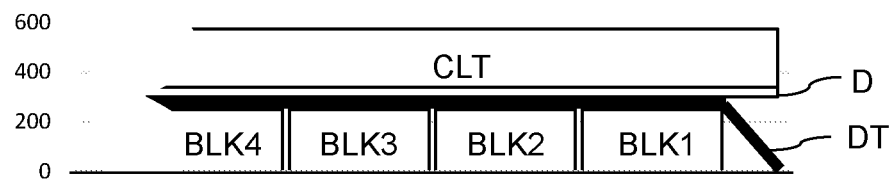
FIGS. 14A to 14D are diagrams illustrating the thrust-up sequences of a first operation example.
Figure 14B:
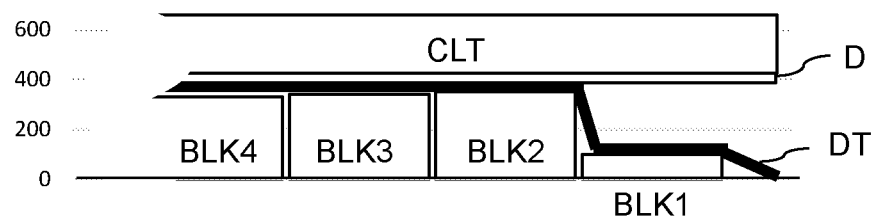
Figure 14C:
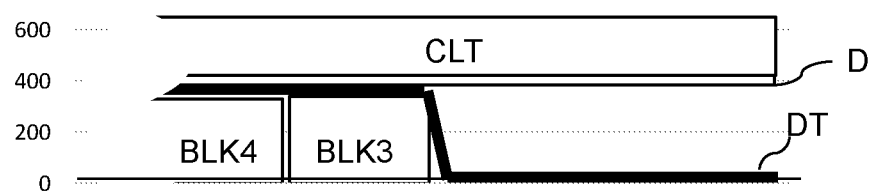
Figure 14D:
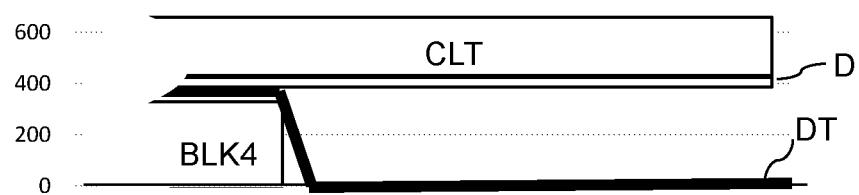

The thrust-up sequences of a first operation example that changes part of the thrust-up sequences of the RMS of FIGS. 3A to 3D will be described with reference to FIGS. 14A to 14D and FIG. 15. FIG. 14A is a diagram illustrating a first state of the thrust-up block sequence of the first operation example. FIG. 14B is a diagram illustrating a second state of the thrust-up block sequence of the first operation example. FIG. 14C is a diagram illustrating a third state of the thrust-up block sequence of the first operation example. FIG. 14D is a diagram illustrating a fourth state of the thrust-up block sequence of the first operation example. FIG. 15 is a diagram illustrating an example of the block operation timing of the sequences of FIGS. 14A to 14D.

As illustrated in FIG. 14A, in a first step (STEP1), each of the blocks BLK1 to BLK4 is lifted from the cycle height (here, 0) to above the height at which the outer periphery of the die D is separated from the dicing tape DT, and is brought into the first state. For example, when the thrust-up height of the blocks BLK1 to BLK4 is 250 μm, and the thrust-up speed of the blocks BLK1 to BLK4 is 1 mm/s, the length of the first step is 250 ms. By the lifting of the blocks BLK1 to BLK4, the separation of the outer periphery of the die D from the dicing tape DT occurs.

As illustrated in FIG. 14B, in a second step (STEP2), each of the blocks BLK2 to BLK4 is further lifted to be at the initial thrust-up height, whereas to secure a step in which the die D on the upper face of the block BLK1 is separated from the dicing tape DT, the block BLK1 is lowered to be in the second state. For example, the thrust-up heights of the blocks BLK1 to BLK4 are 100 μm, 350 μm, 340 μm, and 330 μm, respectively, and the thrust-up speed of the blocks BLK1 to BLK4 is 1 mm/s. The length of the second step is 1150 ms. With this, the separation of the die D from the dicing tape DT is advanced to the upper face of the block BLK1 (the edge of the block BLK2). At this time, the collet CLT completely absorbs the die D. The operation so far is the initial separation operation (the operation of separating the outer periphery of the die).

As illustrated in FIG. 14C, in a third step (STEP3), each of the block BLK1 and the block BLK2 is lowered to the cycle height at the predetermined speed. For example, the thrust-up speed (lowering speed) of the blocks BLK1 and BLK2 is 5 mm/s. The length of the third step is 170 ms. The separation of the die D from the dicing tape DT is advanced to the upper face of the block BLK2 (the edge of the block BLK3). At this time, the die is absorbed onto the collet CLT, and the upper face of the block BLK 1 has been separated, and the die D at the lowering of the block BLK1 is not deformed, or is deformed in a very small amount.

As illustrated in FIG. 14D, in a fourth step (STEP4), the block BLK3 is lowered to the cycle height at the predetermined speed. For example, the thrust-up speed (lowering speed) of the blocks BLK1 and BLK2 is 5 mm/s. The back face of the die D is separated from the dicing tape DT to the edge of the block BLK4.

As described above, during the lifting to the initial thrust-up height in the first step and the second step, the separation of the outer periphery of the die D from the dicing tape DT and the separation of the die D from the dicing tape DT to the upper face of the block BLK1 are advanced. In the third step thereafter, by performing the lowering operation of the block BLK1, the deformation of the die can be minimum.

Second Operation Example

Figure 16A:
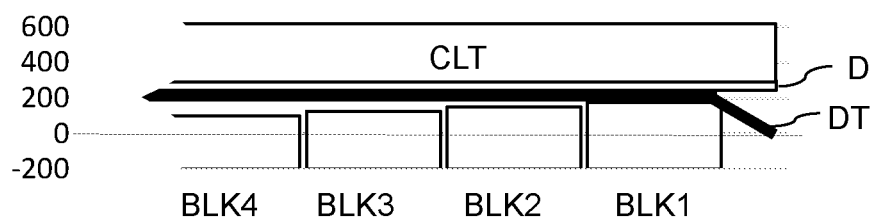
FIGS. 16A to 16D are diagrams illustrating the thrust-up sequences of a second operation example.
Figure 16B:
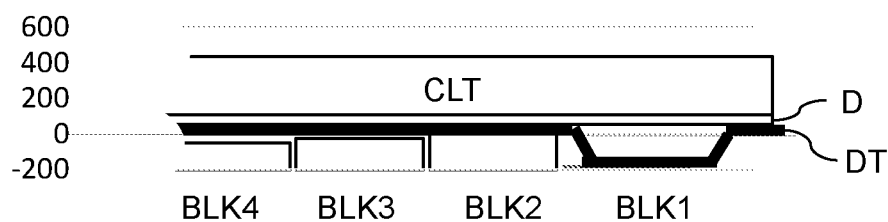
Figure 16C:
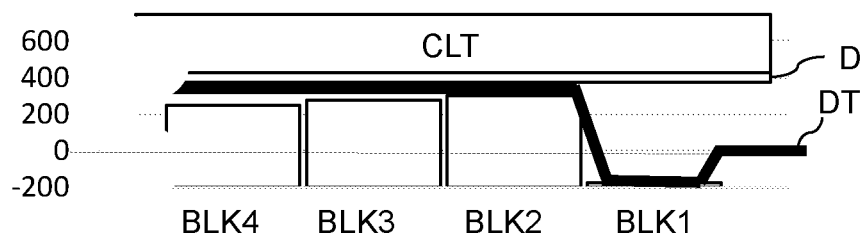
Figure 16D:
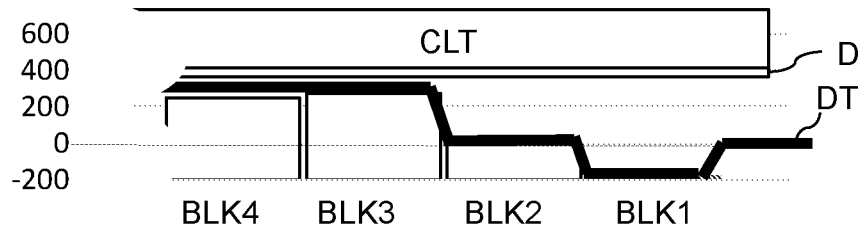
Figure 17:
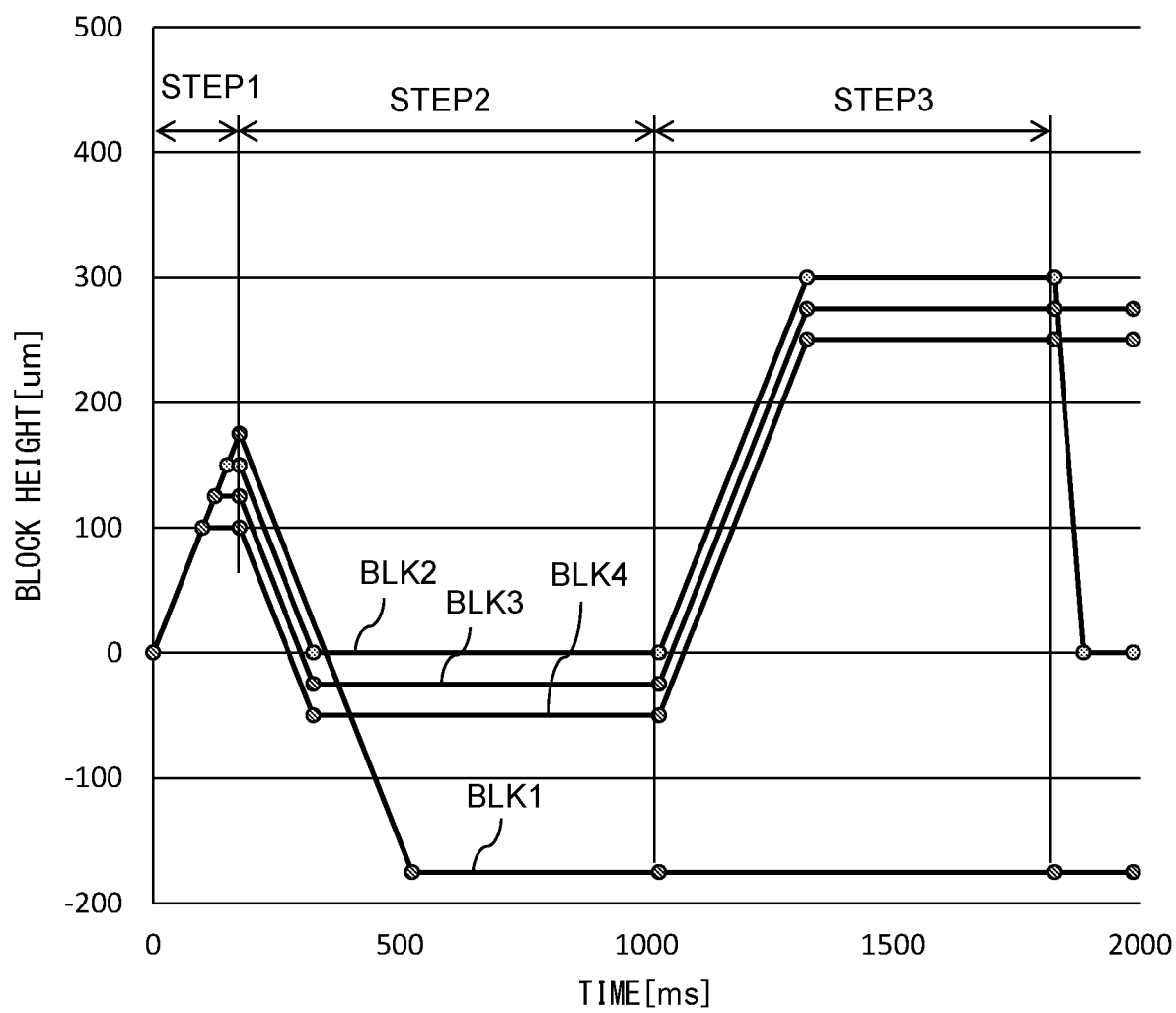
FIG. 17 is a diagram illustrating the block operation timing of the thrust-up sequences of the second operation example.

The thrust-up sequences of a second operation example will be described with reference to FIGS. 16A to 16D and FIG. 17. FIG. 16A is a diagram illustrating a first state of the thrust-up block sequence of the second operation example. FIG. 16B is a diagram illustrating a second state of the thrust-up block sequence of the second operation example. FIG. 16C is a diagram illustrating a third state of the thrust-up block sequence of the second operation example. FIG. 16D is a diagram illustrating a fourth state of the thrust-up block sequence of the second operation example. FIG. 17 is a diagram illustrating an example of the block operation timing of the sequences of FIGS. 16A to 16D.

As illustrated in FIG. 16A, in a first step (STEP1), each of the blocks BLK1 to BLK4 is lifted to the predetermined height at the predetermined speed to be in the first state. For example, when the thrust-up heights of the blocks BLK1 to BLK4 are 175 μm, 150 μm, 125 μm, and 100 μm, respectively, and the thrust-up speed of the blocks BLK1 to BLK4 is 1 mm/s. The length of the first step is 175 ms. By the lifting of the blocks BLK1 to BLK4, the separation of the outer periphery of the die D from the dicing tape DT occurs.

As illustrated in FIG. 16B, in a second step (STEP2), each of the blocks BLK1 to BLK4 is lowered to the predetermined height at the predetermined speed, and the block BLK1 is further lowered to be in the second state. For example, the thrust-up heights of the blocks BLK1 to BLK4 are −175 μm, 0 μm, −25 μm, and −50 μm, respectively, and the thrust-up speed (lowering speed) of the blocks BLK1 to BLK4 is 1 mm/s. The length of the second step is 850 ms. The die D on the upper face of the block BLK1 is separated from the dicing tape DT. In the state where the outer peripheral portion of the separated die D is sandwiched between the upper face of the dome plate DP and the collet CLT, the die D on the upper face of the block BLK1 is separated from the dicing tape DT to reduce the deformation of the die D.

As illustrated in FIG. 16C, in a third step (STEP3), each of the blocks BLK2 to BLK4 is lifted to the predetermined height at the predetermined speed to be in the third state. For example, the thrust-up heights of the blocks BLK1 to BLK4 are −175 μm, 300 μm, 275 μm, and 250 μm, respectively, and the thrust-up speed of the blocks BLK2 to BLK4 is 1 mm/s. The length of the third step is 850 ms.

As illustrated in FIG. 16D, in a fourth step (STEP4), the block BLK2 is lowered to the predetermined height at the predetermined speed to be in the fourth state. For example, the thrust-up heights of the blocks BLK1 to BLK4 are −175 μm, 0 μm, 275 μm, and 250 μm, respectively, and the thrust-up speed (lowering speed) of the block BLK2 is 5 mm/s. The length of the fourth step is 160 ms.

Third Operation Example

Figure 18:
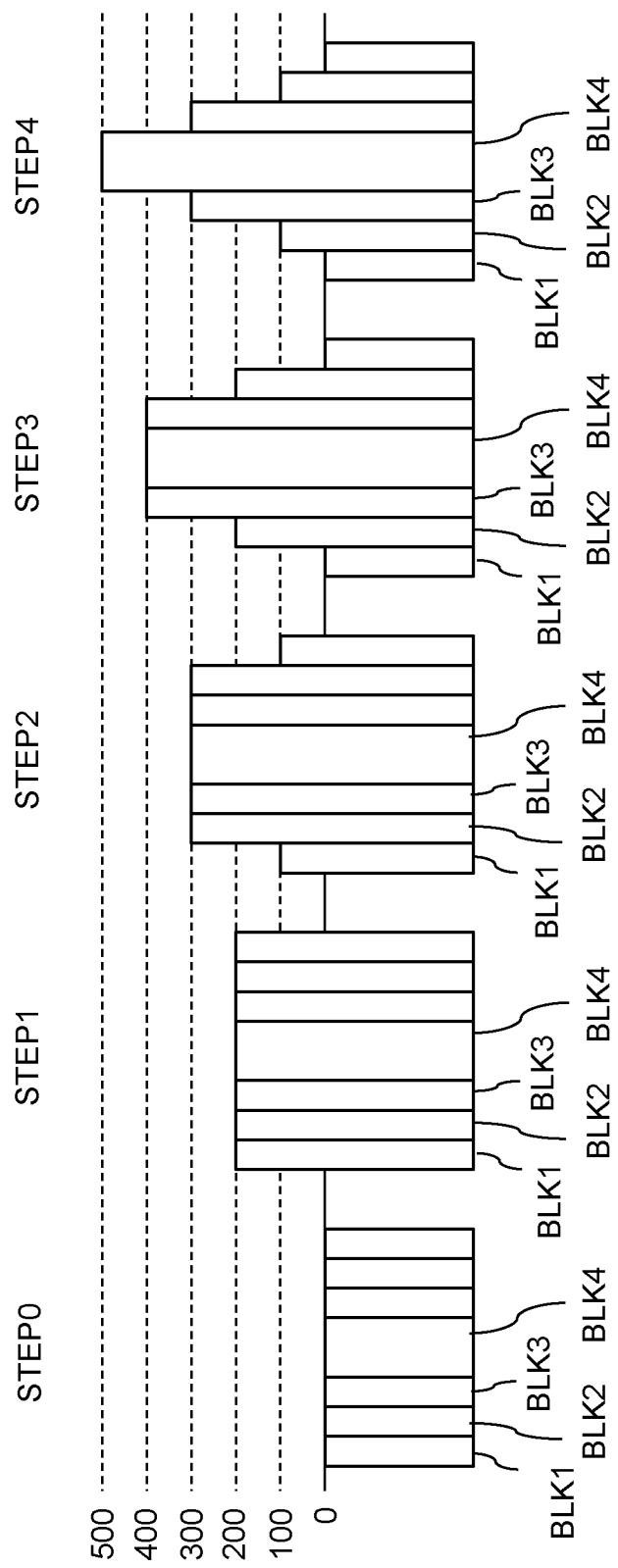
FIG. 18 is a diagram illustrating the thrust-up sequences of a third operation example.

The thrust-up sequences of a third operation example will be described with reference to FIG. 18. FIG. 18 is a diagram illustrating the thrust-up block sequences of the third operation example.

In a zeroth step (STEP0), each of the blocks BLK1 to BLK4 is placed at the waiting position (the height of 0 μm).

In a first step (STEP1), each of the blocks BLK1 to BLK4 is lifted to the predetermined height at the predetermined speed. For example, the thrust-up height of each of the blocks BLK1 to BLK4 is 200 μm, and the thrust-up speed of the blocks BLK1 to BLK4 is 1 mm/s. The outer periphery of the die D is separated from the dicing tape DT. Thus, the block step at the separation of the outer periphery of the die D from the dicing tape DT is 200 μm.

In a second step (STEP2), the block BLK1 is lowered to the predetermined height at the predetermined speed, and each of the BLK2 to the BLK4 is lifted to the predetermined height at the predetermined speed. For example, the thrust-up heights of the blocks BLK1 to BLK4 are 100 μm, 300 μm, 300 μm, and 300 μm, respectively, and the thrust-up speed (lowering speed or lifting speed) of each of the blocks BLK1 to BLK4 is 5 mm/s. The die D on the upper face of the block BLK1 is separated from the dicing tape DT. The block BLK1 is lowered by 100 μm at 5 mm/s, and the blocks BLK2 to BLK4 are lifted by 100 μm at 5 mm/s.

In a third step (STEP3), each of the blocks BLK1 and BLK2 is lowered to the predetermined height at the predetermined speed, and each of the BLK3 and BLK4 is lifted to the predetermined height at the predetermined speed. For example, the thrust-up heights of the blocks BLK1 to BLK4 are 0 μm, 200 μm, 400 μm, and 400 μm, respectively, and the thrust-up speed (lowering speed or lifting speed) of each of the blocks BLK1 to BLK4 is 5 mm/s. The die D on the upper face of the block BLK2 is separated from the dicing tape DT. The block BLK2 is lowered by 100 μm at 5 mm/s, and the blocks BLK3 and BLK4 are lifted by 100 μm at 5 mm/s.

In a fourth step (STEP4), each of the blocks BLK2 and BLK3 is lowered to the predetermined height at the predetermined speed, and the BLK4 is lifted to the predetermined height at the predetermined speed. For example, the thrust-up heights of the blocks BLK1 to BLK4 are 0 μm, 100 μm, 300 μm, and 500 μm, respectively, and the thrust-up speed (lowering speed or lifting speed) of each of the blocks BLK1 to BLK4 is 5 mm/s. The die D on the upper face of the block BLK2 is separated from the dicing tape DT. The block BLK3 is lowered by 100 μm at 5 mm/s, and the block BLK4 is lifted by 100 μm at 5 mm/s.

In the third operation example, by operating the thrust-up block up and down, the block can be operated at a relative speed of 10 mm/s even when a motor having the highest speed of 5 mm/s is used.

Fourth Operation Example

Figure 19:
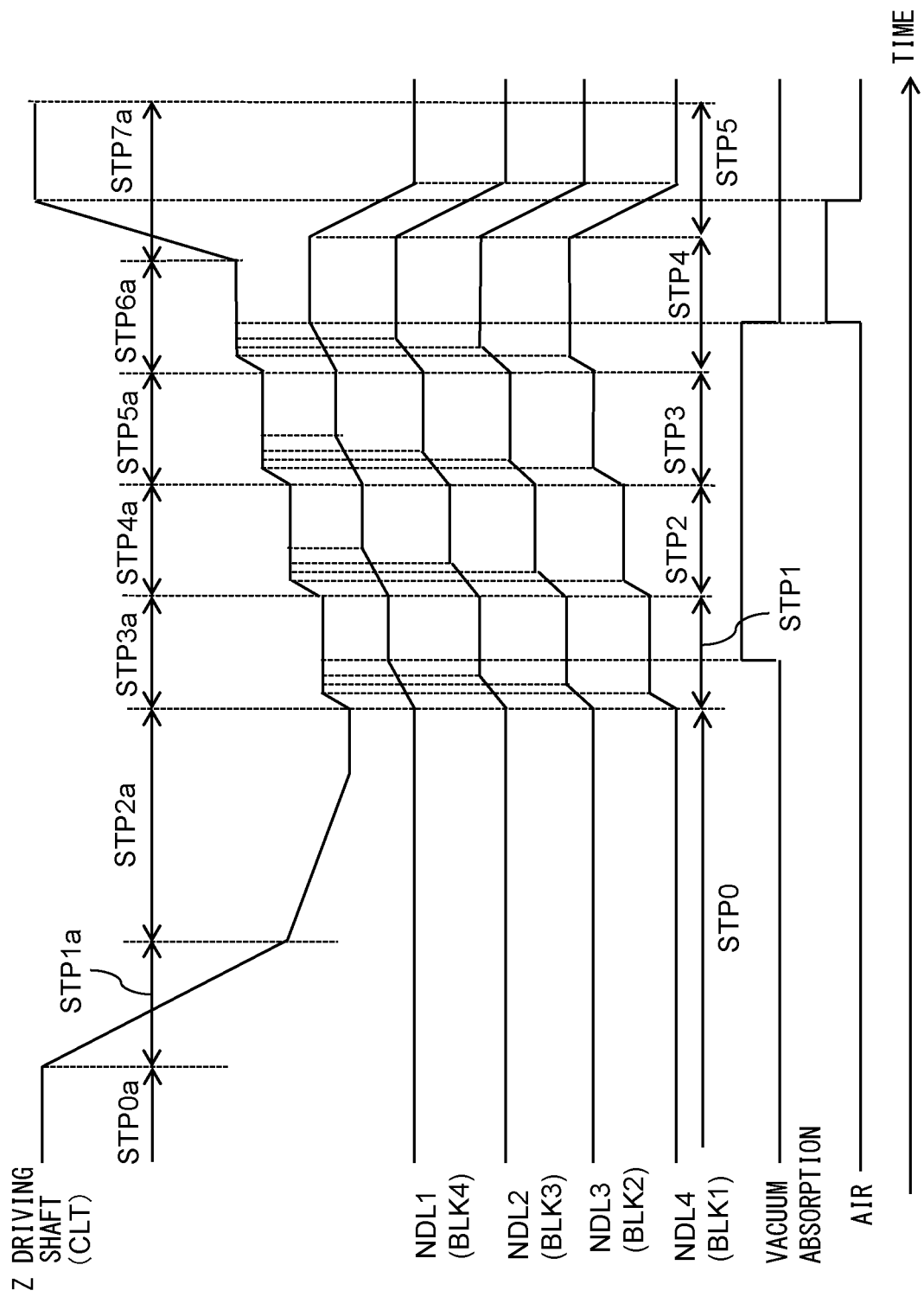
FIG. 19 is a diagram illustrating the thrust-up sequences of a fourth operation example.

The thrust-up sequences of a fourth operation example will be described with reference to FIG. 19. FIG. 19 is a diagram illustrating the operation timing of the block of the thrust-up unit and the collet of the fourth operation example.

Although the control of the operation of the block BLK of the thrust-up unit on the basis of the setting of the time chart recipe has been described until the third operation example, the operation of the collet CLT provided to the head BH may be controlled. In this case, the collet CLT is also operated in conjunction with the block BLK of the thrust-up unit TU.

As illustrated in FIG. 19, the fourth operation example is started with the positioning of the targeted die D on the dicing tape DT to the thrust-up unit TU and the collet CLT by the operation controller 81b. When the positioning is completed, the operation controller 81b performs vacuumizing through the suction holes and the gaps, not illustrated, of the thrust-up unit TU, so that the dicing tape DT is absorbed onto the upper face of the thrust-up unit TU (a zeroth step (STP0)). At this time, the upper faces of the blocks BLK1 to BLK4 are at the same height as the upper face of the dome plate DP (initial position). In that state, the operation controller 81b supplies vacuum from the vacuum supply source, and lowers the collet CLT toward the device face of the die D at the predetermined speed while performing vacuumizing (a first step (STP1a)) and lands the collet CLT at the lowered predetermined speed (a second step (STP2a)).

Thereafter, the operation controller 81b lifts the respective blocks BLK1 to BLK4 to the predetermined heights at the same time at the constant speeds (a first step (STP1)). Here, the thrust-up speed of the collet CLT is lower in the order of the block BLK1, the block BLK2, the block BLK3, and the block BLK4. The operation controller 81b lifts the collet CLT in conjunction with the thrust-up operation of the block BLK1 in the outermost periphery having the highest thrust-up speed (a third step (STP3a)). The operation controller 81b performs the absorption of the dicing tape DT by the vacuum absorption when the predetermined time elapses after the first-stage thrust-up operation of the blocks BLK1 to BLK4.

Thereafter, the operation controller 81b lifts the respective blocks BLK1 to BLK4 to the predetermined heights at the same time three times at the constant speeds (a second step (STP2), a third step (STP3), and a fourth step (STP4)). At this time, the operation controller 81b lifts the collet CLT in conjunction with the thrust-up operation of the block BLK1 in the outermost periphery having the highest thrust-up speed (a fourth step (STP4a), a fifth step (STP5a), and a sixth step (STP6a)).

The operation controller 81b stops the vacuum suction and starts the blowout of air when the predetermined time elapses after the fourth-stage thrust-up operation of the blocks BLK1 to BLK4 (the fourth step (STP4)). Thereafter, the operation controller 81b lifts the collet CLT to separate the entire die D from the dicing tape DT. Thereafter, the operation controller 81b returns the blocks BLK1 to BLK4 to the initial position (a fifth step (STP5)). The operation controller 81b stops the blowout of air at the timing at which the collet is returned to the initial position. The collet CLT picks up the die D and is lifted, and the dicing tape DT can be removed from the thrust-up unit TU by the blowout of air.

Fifth Operation Example

When some malfunction is caused while the thrust-up unit TU performs the thrust-up operation of the block BLK, the thrust-up operation is varied and performed (continued) according to the condition of the malfunction without being interrupted for retry and stopped.

For example, in the first state of FIG. 3A, as described above, the dicing tape DT is separated in the periphery of the die D. However, on the other hand, at this time, the periphery of the die D receives a stress on its lower side, and is curved. Then, a gap is formed between the die D and the lower face of the collet CLT, so that air flows into the vacuum suction system of the collet CLT. As a result, the suction amount output of the gas flow rate sensor 87c provided in the vacuum suction system is increased, and leak is detected. When the leak is detected while the block BLK1 that is the outermost peripheral block is lifted, and the leak amount is the predetermined value or less, the operation of the driving of each of the blocks BLK1 to BLK4 of the thrust-up unit TU is continued. In particular, when all the blocks BLK1 to BLK4 are lifted at first, the blocks BLK1 to BLK4 are lifted until the separation is started within the predetermined range. That is, for example, in the case of the thrust-up operation sequences of FIG. 4A, even when leak is caused, the lifting of the blocks BLK1 to BLK4 in the first step is continued. With this, according to the degree of an abnormality caused during the operation, the process can be performed to save the die. It should be noted that when the leak amount is more than the predetermined value, the operation of the driving of each of the blocks BLK1 to BLK4 of the thrust-up unit TU is changed to be performed, retried, and stopped.

Sixth Operation Example

With the shape of the die D to be picked up, the operation of the blocks BLK1 to BLK4 of the thrust-up unit TU is performed on the basis of the time chart recipe set according to the previously assumed operation conditions. Further, by image recognition and a measuring element, such as a laser displacement meter, the shape of the die D to be picked up is measured, or the specific shape that the device has is stored and referred, and the time chart recipe to which the thrust-up procedure suitable for it (the block operation order and the height) is set is selected to perform the pick-up. With this, the pick-up of the die deformed due to the influence of the product structure can be optimized for each shape.

Seventh Operation Example

The operation of the driving (shaft) of each of the blocks BLK1 to BLK4 of the thrust-up unit TU is performed on the basis of the time chart recipe set according to the state of the adjacent (peripheral) area in the wafer of the die D to be picked up. Since the extension allowance and the like of the dicing tape DT is significantly changed according to the presence or absence of the die D in the adjacent area, and the thrust-up amount for partially extending this is different, the operation is performed at the thrust-up height and the thrust-up speed according to this. With this, the influence according to the presence or absence of the die D on the adjacent wafer can be reduced.

Eighth Operation Example

The operation of lowering the block near the center (for example, only the block BLK4, or both of the block BLK3 and the block BLK4) is performed during the lifting of all the blocks BLK1 to BLK4 of the thrust-up unit TU. With this, also in the pick-up by the collet having a convex curved shape on its absorption face and used for void solution and the like during bonding, and the like, the stable die thrust-up operation can be performed.

Ninth Operation Example

The previously observed backlash of the ball screw and the gear of the thrust-up unit TU is corrected to set the time chart recipe, and the thrust-up operation is performed on the basis of the set time chart recipe. With this, the influence due to the machine difference between the devices of the thrust-up unit TU can be reduced.

Tenth Operation Example

The thrust-up operation is performed on the basis of the time chart recipe set on the basis of the parameter calculated from the operation data obtained by previously evaluating the operation of the driving (shaft) of each of the blocks BLK1 to BLK4 of the thrust-up unit TU. With this, the optimum non-linear thrust-up sequences can be executed.

Eleventh Operation Example

The data obtained by performing simulation on the external PC is set to the time chart recipe, and the thrust-up operation is performed on the basis of the set time chart recipe. With this, the optimum non-linear thrust-up sequences can be executed.

Twelfth Operation Example

The data obtained by monitoring the actual separation state by an imaging device and the like is fed back to performing simulation and the fed back simulation data is set to the time chart recipe, and the thrust-up operation is performed on the basis of the set time chart recipe. With this, the optimum non-linear thrust-up sequences can be executed.

Thirteenth Operation Example

When the pick-up is stably performed, the block BLK1 in the outermost periphery is lowered to observe leak by the sensor 87b, and the separation of the die D from the dicing tape DT is observed by the imaging device and the like, the operation is advanced to the lowering. With this, the stress to the die due to the continuously performed separation operation in the state where the outer periphery of the die is not separated can be reduced, and the pick-up of the die can be performed in the always stable state without cracking.

According to the embodiment, the operation of the block of the thrust-up unit can be freely set by the program recipe. With this, each optimum block according to the type and the structure of a targeted product and the type of the material from the viewpoint of the low stress properties to the die or the high-speed pick-up properties can be operated. With this, the die bonding of the thin die can be performed without cracking.

Also, according to the embodiment, the switching (free setting) to the operation according to the condition of the die being operated is enabled even during the operation. With this, according to the condition observed during the operation, the operation is stopped once in each step, and can be restarted during that. With this, the suitable operation according to the die, the material, and the change due to the environment can be performed.

EXAMPLE

Figure 20:
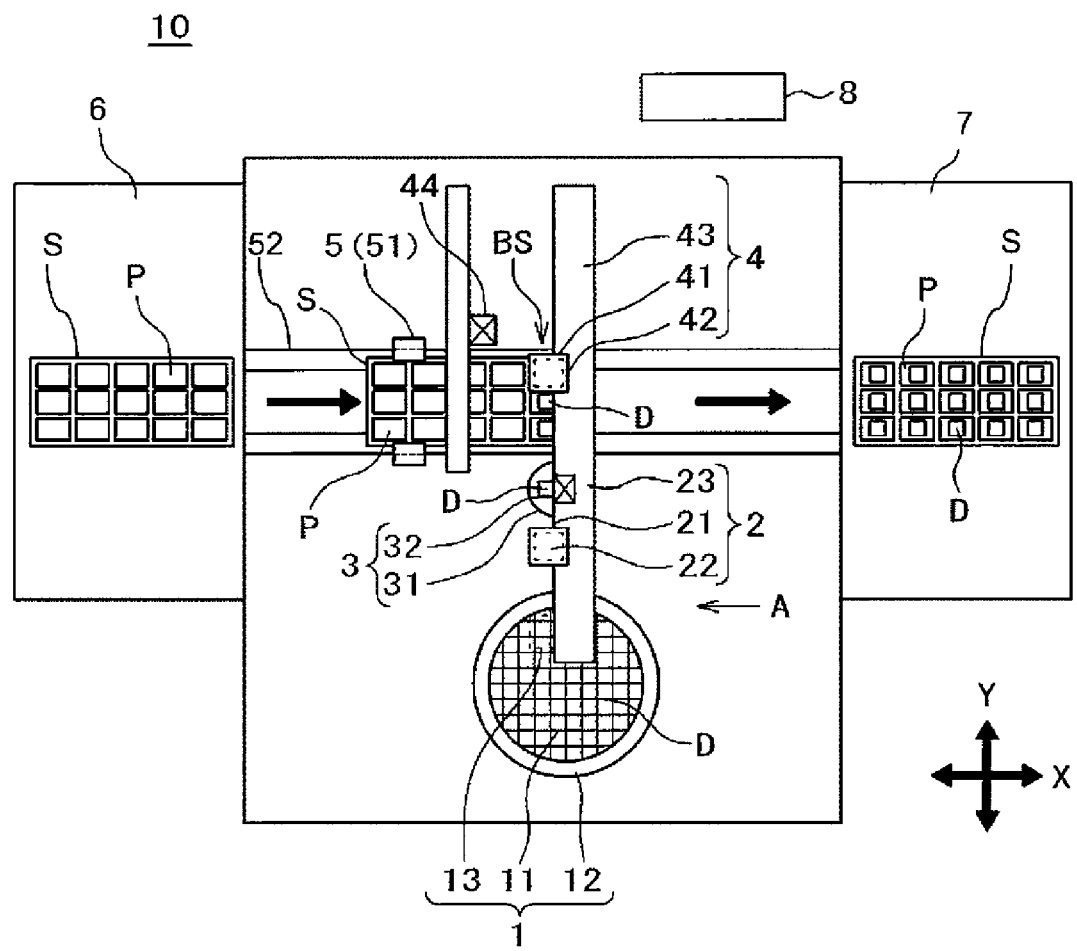
FIG. 20 is a concept diagram of a die bonder according to an example, seen from the top.
Figure 21:
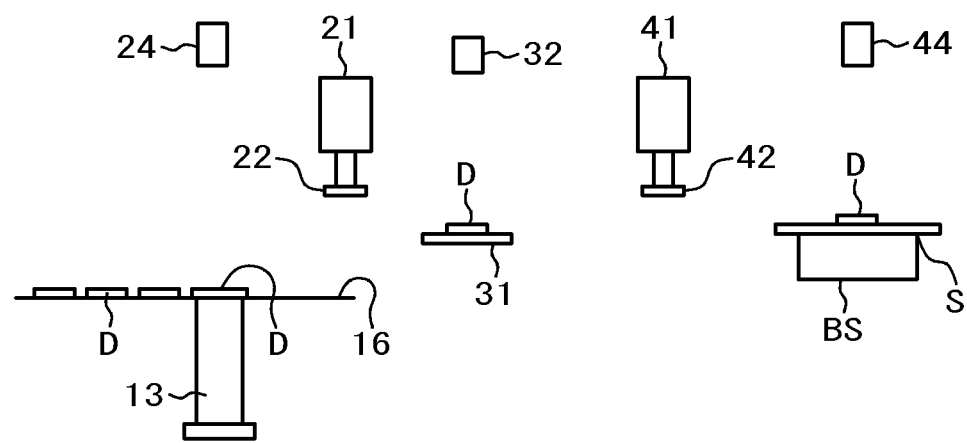
FIG. 21 is a diagram of assistance in explaining the operation of a pick-up head and a bonding head, seen in the direction of an arrow A of FIG. 20.

FIG. 20 is a top view illustrating the overview of the die bonder according to an example. FIG. 21 is a diagram of assistance in explaining the operation of the pick-up head and the bonding head, seen from the direction of the arrow A of FIG. 20.

A die bonder 10 that is an example of the semiconductor manufacturing apparatus is divided roughly to have a die supplying section 1 supplying the die D to be mounted onto a substrate S on which one or a plurality of product areas becoming one final package (hereinafter, referred to as a package area P or package areas P) are printed, a pick-up section 2, an intermediate stage section 3, a bonding section 4, a conveying section 5, a substrate supplying section 6, a substrate conveying-out section 7, and a control section 8 monitoring and controlling the operation of each section. The Y-axis direction is the front-rear direction of the die bonder 10, and the X-axis direction is the left-right direction of the die bonder 10. The die supplying section 1 is disposed on the front side of the die bonder 10, and the bonding section 4 is disposed on the rear side of the die bonder 10.

First, the die supplying section 1 supplies the die D to be mounted on the package area P of the substrate S. The die supplying section 1 has a wafer holding stage 12 holding a wafer 11, and a thrust-up unit 13 indicated by the dotted line and thrusting up the die D from the wafer 11. The die supplying section 1 is moved in the XY-axis direction by a driving element, not illustrated, and moves the die D to be picked up to the position of the thrust-up unit 13.

The pick-up section 2 has a pick-up head 21 picking up the die D, a Y driving section 23 of the pick-up head moving the pick-up head 21 in the Y-axis direction, and respective driving sections, not illustrated, lifting and lowering the collet 22, rotating the collet 22, and moving the collet 22 in the X-axis direction. The pick-up head 21 has the collet 22 (also see FIG. 21) absorbing and holding the thrusted-up die D at its end, picks up the die D from the die supplying section 1, and places it onto an intermediate stage 31. The pick-up head 21 has the respective driving sections, not illustrated, lifting and lowering the collet 22, rotating the collet 22, and moving the collet 22 in the X-axis direction.

The intermediate stage section 3 has the intermediate stage 31 for temporarily placing the die D thereonto, and a stage recognition camera 32 for recognizing the die D on the intermediate stage 31.

The bonding section 4 picks up the die D from the intermediate stage 31, bonds it onto the package area P of the substrate S being conveyed, or bonds it so as to stack it onto the die that is already bonded onto the package area P of the substrate S. The bonding section 4 has a bonding head 41 including a collet 42 (also see FIG. 21) absorbing and holding the die D at its end like the pick-up head 21, a Y-axis driving section 43 moving the bonding head 41 in the Y-axis direction, and a substrate recognition camera 44 imaging the position recognition mark (not illustrated) of the package area P of the substrate S, and recognizing the bonding position.

With such a configuration, the bonding head 41 corrects the pick-up position and posture on the basis of the imaging data of the stage recognition camera 32, picks up the die D from the intermediate stage 31, and bonds the die D onto the substrate on the basis of the imaging data of the substrate recognition camera 44.

The conveying section 5 has substrate conveying claws 51 grasping and conveying the substrate S, and a conveying lane 52 in which the substrate S is moved. The substrate S is moved by driving the nuts, not illustrated, of the substrate conveying claws 51 provided to the conveying lane 52 by ball screws, not illustrated, provided along the conveying lane 52.

With such a configuration, the substrate S is moved to the bonding position from the substrate supplying section 6 along the conveying lane 52, is moved to the substrate conveying-out section 7 after the bonding, and is transferred to the substrate conveying-out section 7.

The control section 8 includes a memory storing a program (software) monitoring and controlling the operation of each section of the die bonder 10, and a central processor unit (CPU) executing the program stored in the memory.

Figure 22:
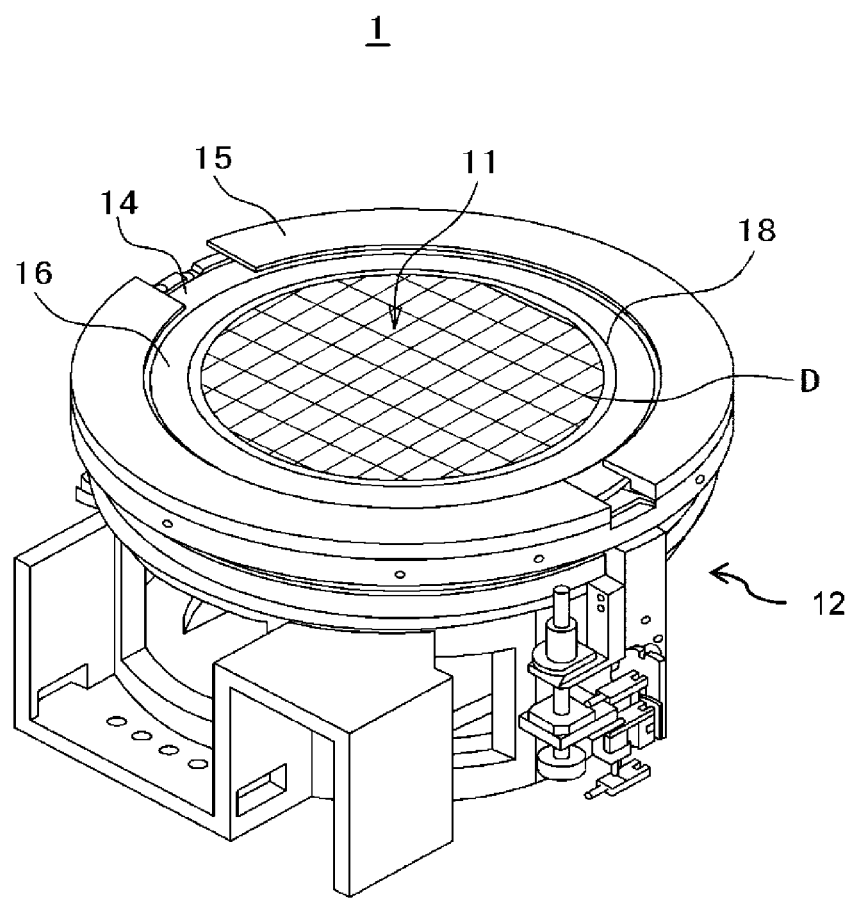
FIG. 22 is a diagram illustrating an appearance perspective view of a die supplying section of FIG. 20.
Figure 23:
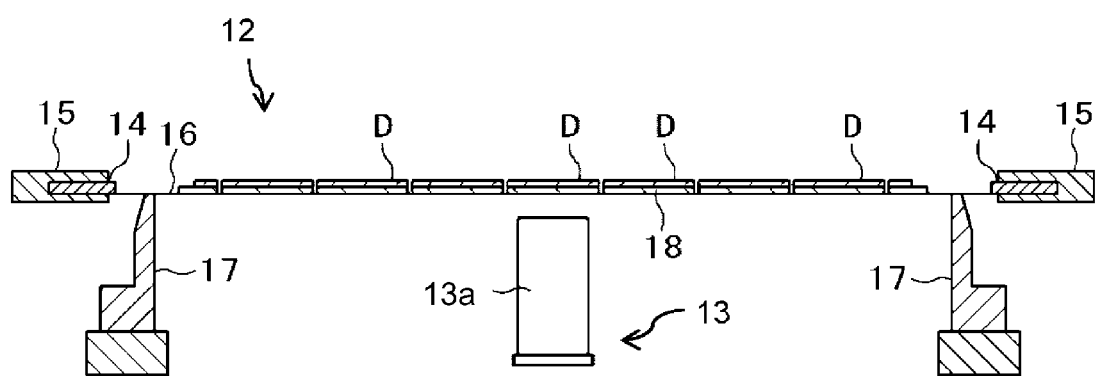
FIG. 23 is a schematic cross-sectional view illustrating the main part of the die supplying section of FIG. 20.

Next, the configuration of the die supplying section 1 will be described with reference to FIGS. 22 and 23. FIG. 22 is a diagram illustrating an appearance perspective view of the die supplying section of FIG. 20. FIG. 23 is a schematic cross-sectional view illustrating the main part of the die supplying section of FIG. 20.

The die supplying section 1 includes the wafer holding stage 12 moved in the horizontal direction (XY-axis direction), and the thrust-up unit 13 moved in the up-down direction. The wafer holding stage 12 has an expand ring 15 holding a wafer ring 14, and a support ring 17 horizontally positioning a dicing tape 16 held by the wafer ring 14 and to which a plurality of dies D are stuck. The thrust-up unit 13 is disposed inside the support ring 17.

The die supplying section 1 lowers the expand ring 15 holding the wafer ring 14 during the thrust-up of the die D. As a result, the dicing tape 16 held by the wafer ring 14 is expanded to increase the gap between the dies D, the die D is thrusted up from the lower side of the die D by the thrust-up unit 13, thereby improving the pick-up properties of the die D. It should be noted that an adhesive sticking the die to the substrate is brought from the liquid form into the film form, and the film-like adhesive material called a die attach film (DAF) 18 is stuck between the wafer 11 and the dicing tape 16. In the wafer 11 having the die attach film 18, the dicing is performed with respect to the wafer 11 and the die attach film 18. Therefore, in the separation step, the wafer 11 and the die attach film 18 are separated from the dicing tape 16. It should be noted that hereinafter, the separation step will be described by neglecting the presence of the die attach film 18.

Figure 24:
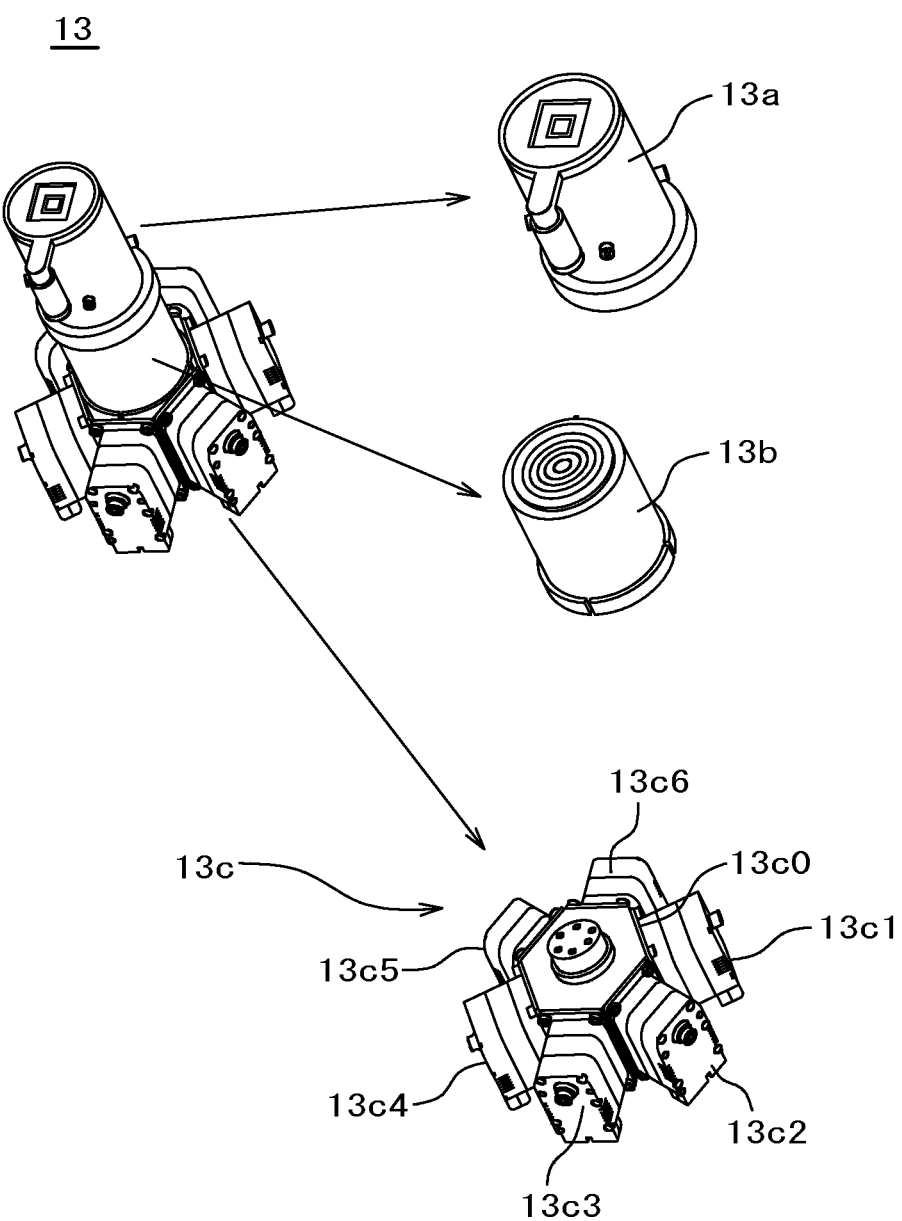
FIG. 24 is an appearance perspective view of the thrust-up unit of FIG. 23.
Figure 25:
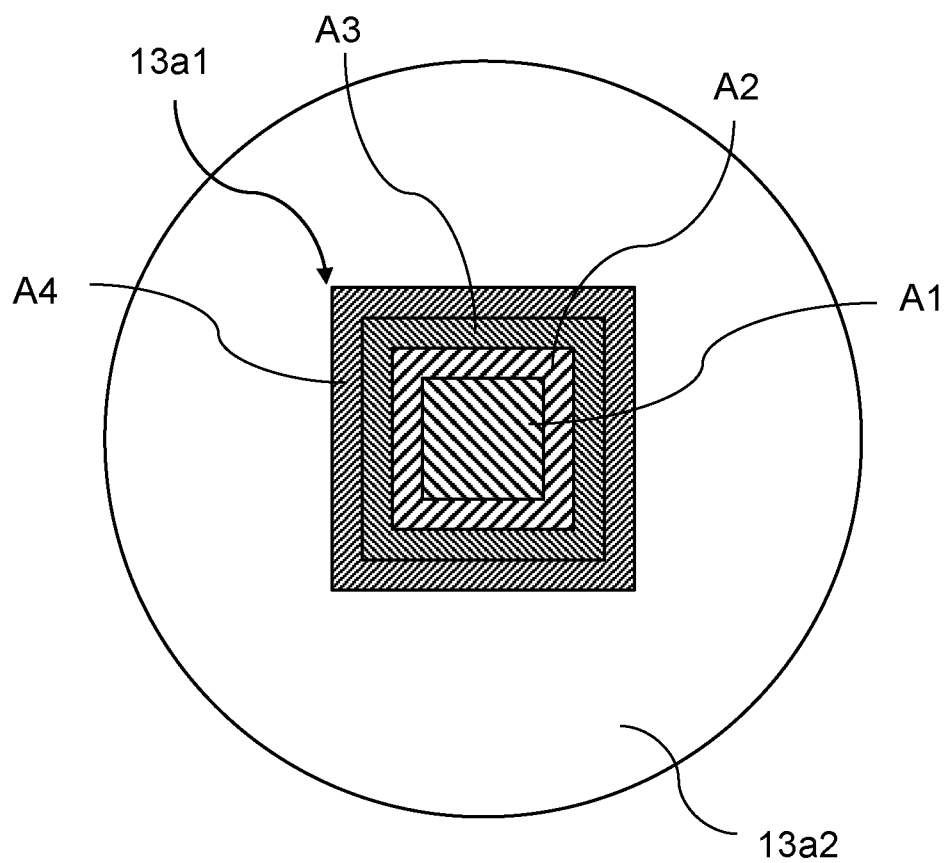
FIG. 25 is a top view of part of a first unit of FIG. 24.
Figure 26:
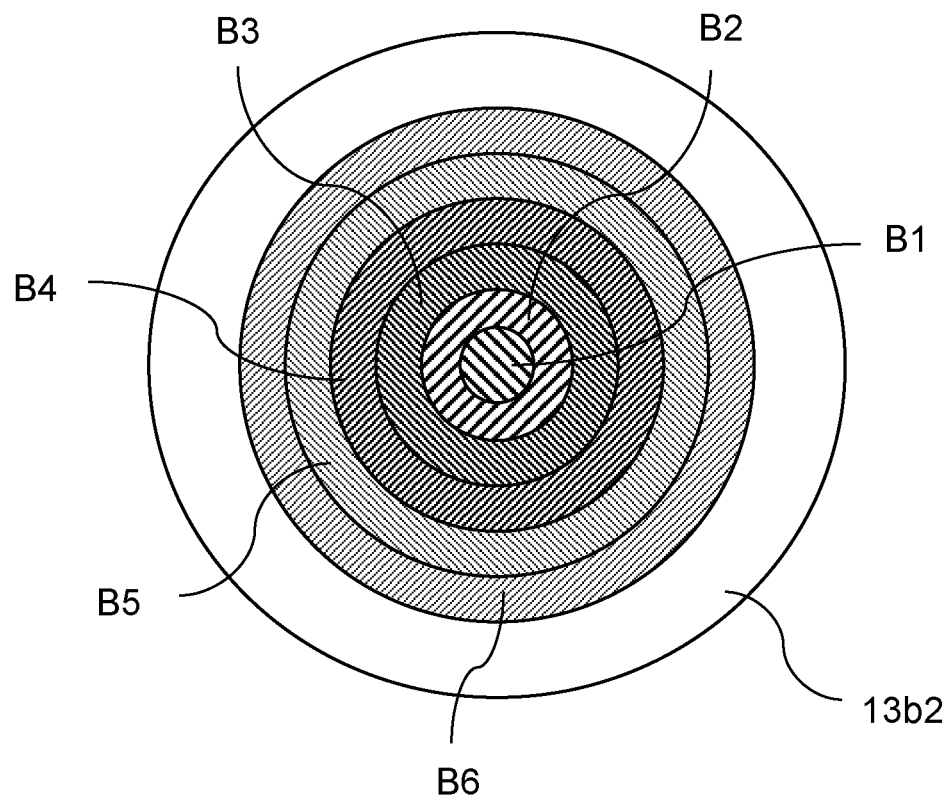
FIG. 26 is a top view of part of a second unit of FIG. 24.
Figure 27:
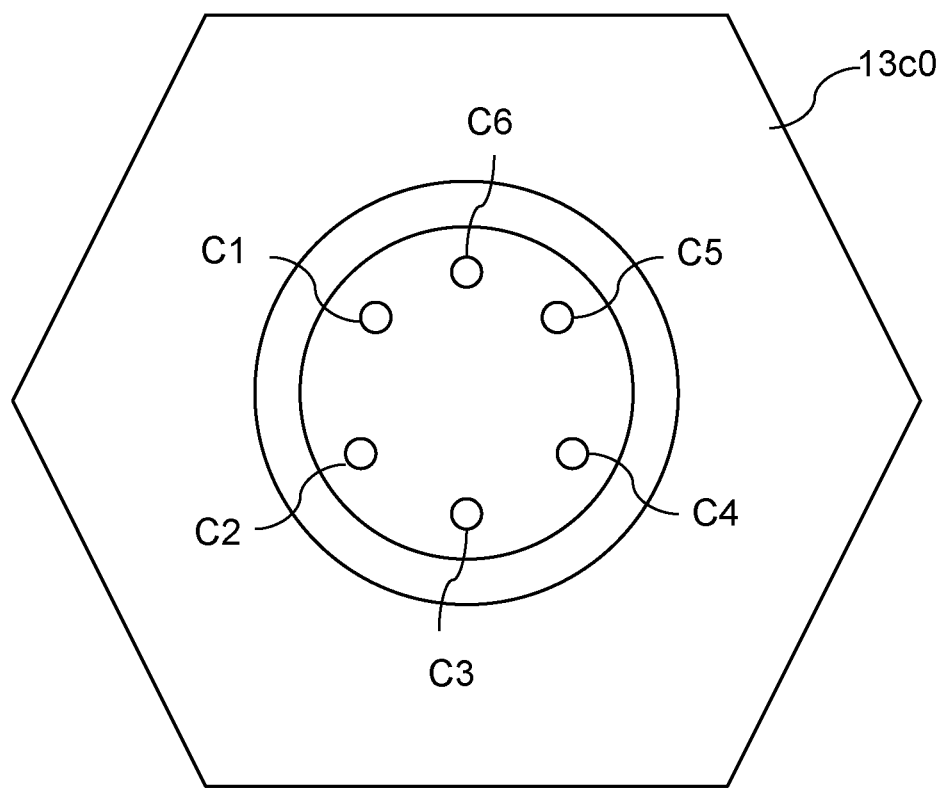
FIG. 27 is a top view of part of a third unit of FIG. 24.
Figure 28:
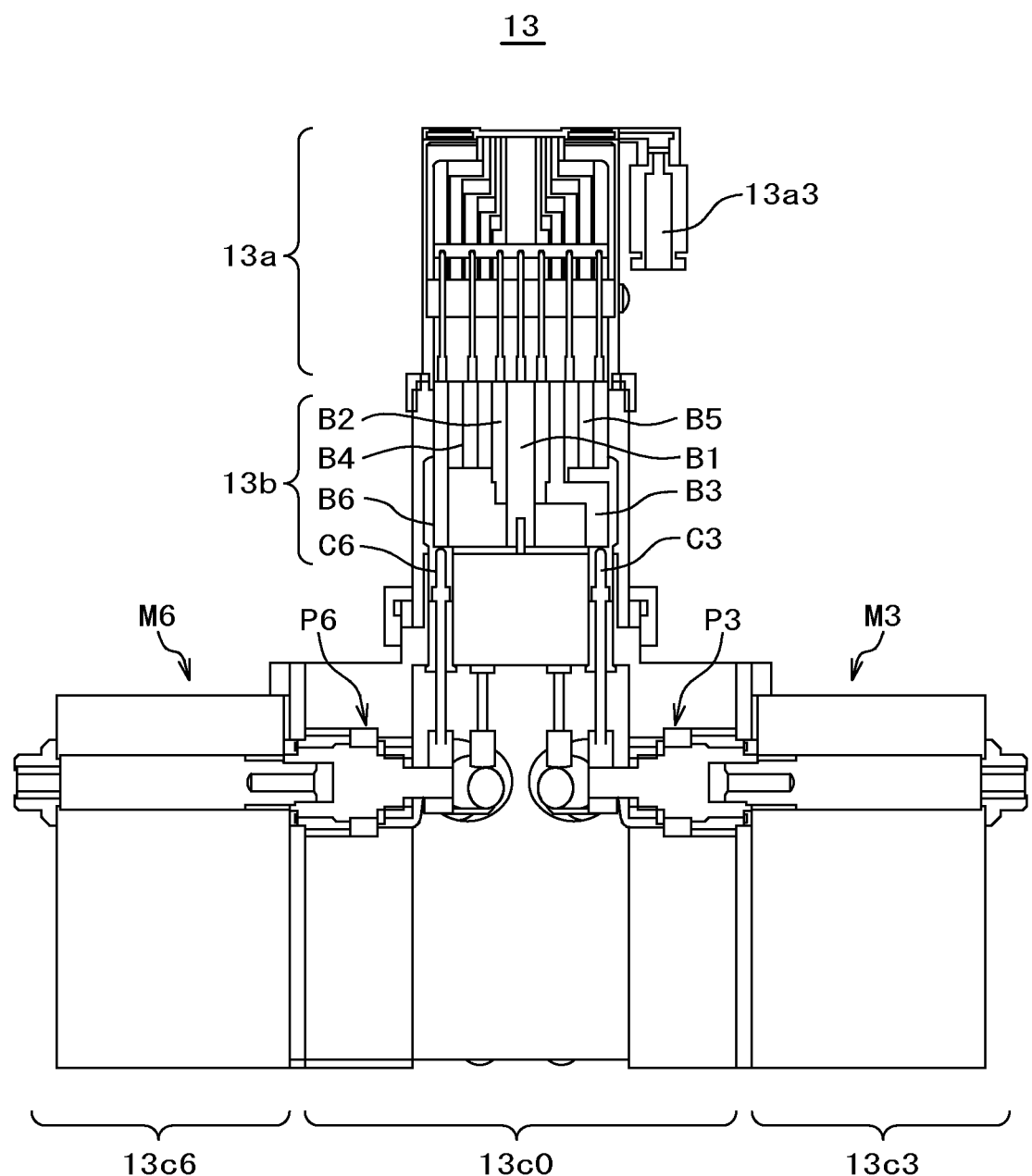
FIG. 28 is a longitudinal cross-sectional view of the thrust-up unit of FIG. 24.
Figure 29:
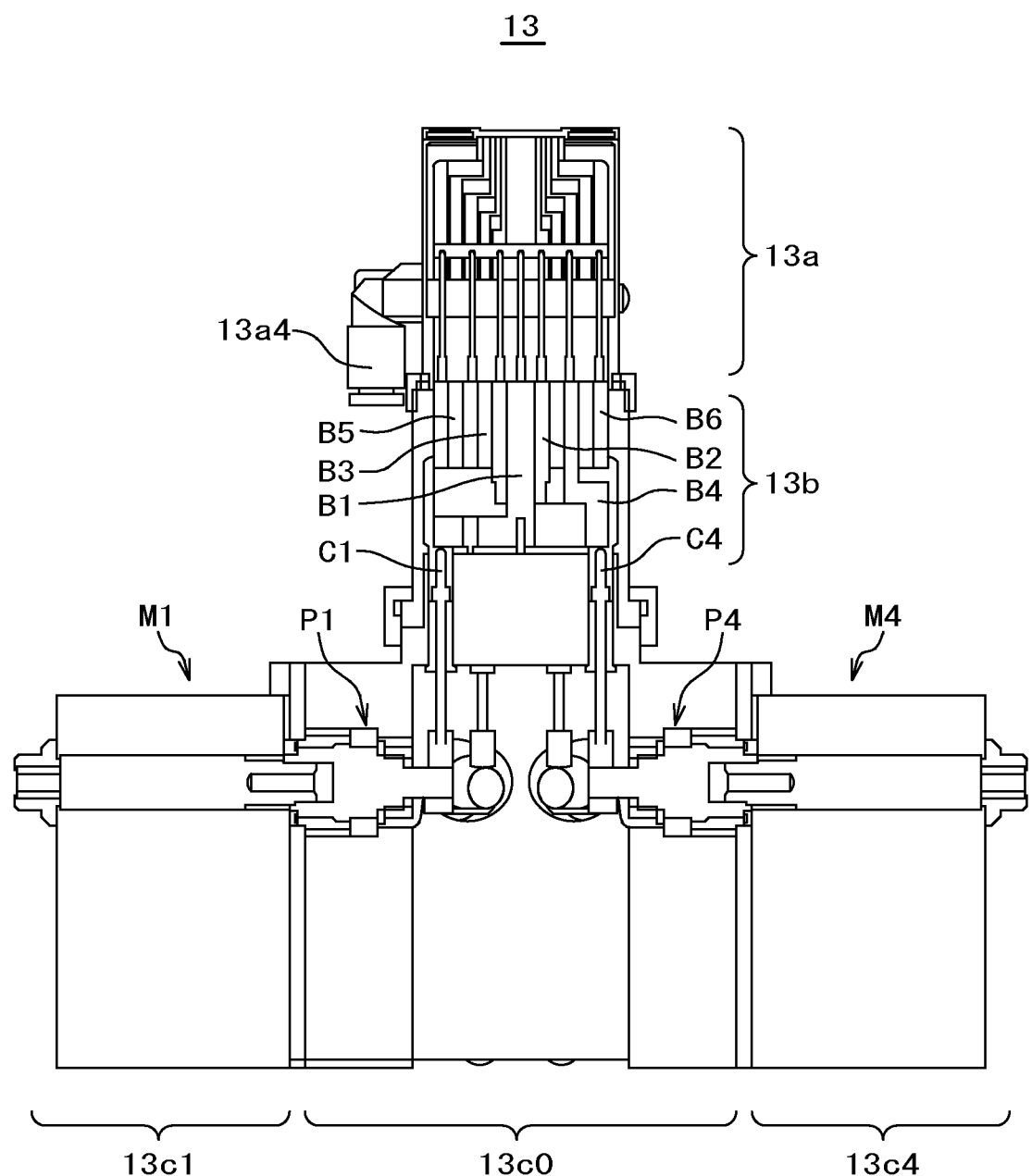
FIG. 29 is a longitudinal cross-sectional view of the thrust-up unit of FIG. 24.

Next, the thrust-up unit 13 will be described with reference to FIGS. 24 to 29. FIG. 24 is an appearance perspective view of the thrust-up unit according to the example. FIG. 25 is a top view of part of a first unit of FIG. 24. FIG. 26 is a top view of part of a second unit of FIG. 24. FIG. 27 is a top view of part of a third unit of FIG. 24. FIG. 28 is a longitudinal cross-sectional view of the thrust-up unit of FIG. 24. FIG. 29 is a longitudinal cross-sectional view of the thrust-up unit of FIG. 24.

The thrust-up unit 13 includes a first unit 13*a*, a second unit 13*b* on which the first unit 13*a* is mounted, and a third unit 13*c* on which the second unit 13*b* is mounted. The second unit 13*b* and the third unit 13*c* are shared portions regardless of the product type, and the first unit 13*a* is a portion that is replaceable for each product type.

The first unit 13*a* has a block 13*a*1 having blocks A1 to A4, a dome plate 13*a*2 having a plurality of absorption holes, a suction hole 13*a*3, and a suction hole 13*a*4 for dome absorption, and converts the up-down movement of blocks B1 to B4 in concentric circular shape of the second unit 13*b* to the up-down movement of the four blocks A1 to A4 in concentric square shape. The blocks A1 to A4 correspond to the blocks BLK4 to BLK1 of the embodiment, respectively. The four blocks A1 to A4 can be moved up and down independently. The planar shape of the blocks A1 to A4 in concentric square shape is matched with the shape of the die D. When the die size is large, the number of blocks in concentric square shape is more than 4. This is enabled since a plurality of output sections of the third unit and the blocks in concentric circular shape of the second unit are moved up and down mutually independently (or are not moved up and down). The thrust-up speed and the thrust-up amount of each of the four blocks A1 to A4 can be set to be programable.

The second unit 13*b* has blocks B1 to B6 in circular tube shape, and an outer peripheral portion 13*b*2, and converts the up-down movement of output sections C1 to C6 disposed on the circumference of the first unit 13*a* to the up-down movement of the six blocks B1 to B6 in concentric circular shape. The six blocks B1 to B6 can be moved up and down mutually independently. Here, since the first unit 13*a* has only the four blocks A1 to A4, the blocks B5 and B6 are not used.

The third unit 13*c* includes a center portion 13*c*0, and six peripheral portions 13*c*1 to 13*c*6. The center portion 13*c*0 has the six output sections C1 to C6 disposed at equal intervals on the circumference of its upper face and moved up and down independently. The peripheral portions 13*c*1 to 13*c*6 can drive the output sections C1 to C6 mutually independently, respectively. The peripheral portions 13*c*1 to 13*c*6 include motors M1 to M6, respectively, and the center portion 13*c*0 is provided with plunger mechanisms P1 to P6 converting the rotation of the motors to the up-down movement by cams or links. The plunger mechanisms P1 to P6 give up-down movement to the output sections C1 to C6, respectively. It should be noted that the motors M2 and M5 and the plunger mechanisms P2 and P5 are not illustrated. Here, since the first unit 13*a* has only the four blocks A1 to A4, the peripheral portions 13*c*5 and 13*c*6 are not used. Thus, the motors M5 and M6, the plunger mechanisms P5 and P6, and the output sections C5 and C6 are not used. The output sections C1 to C4 correspond to the needles NDL1 to NDL4 of the embodiment, respectively.

Figure 30:
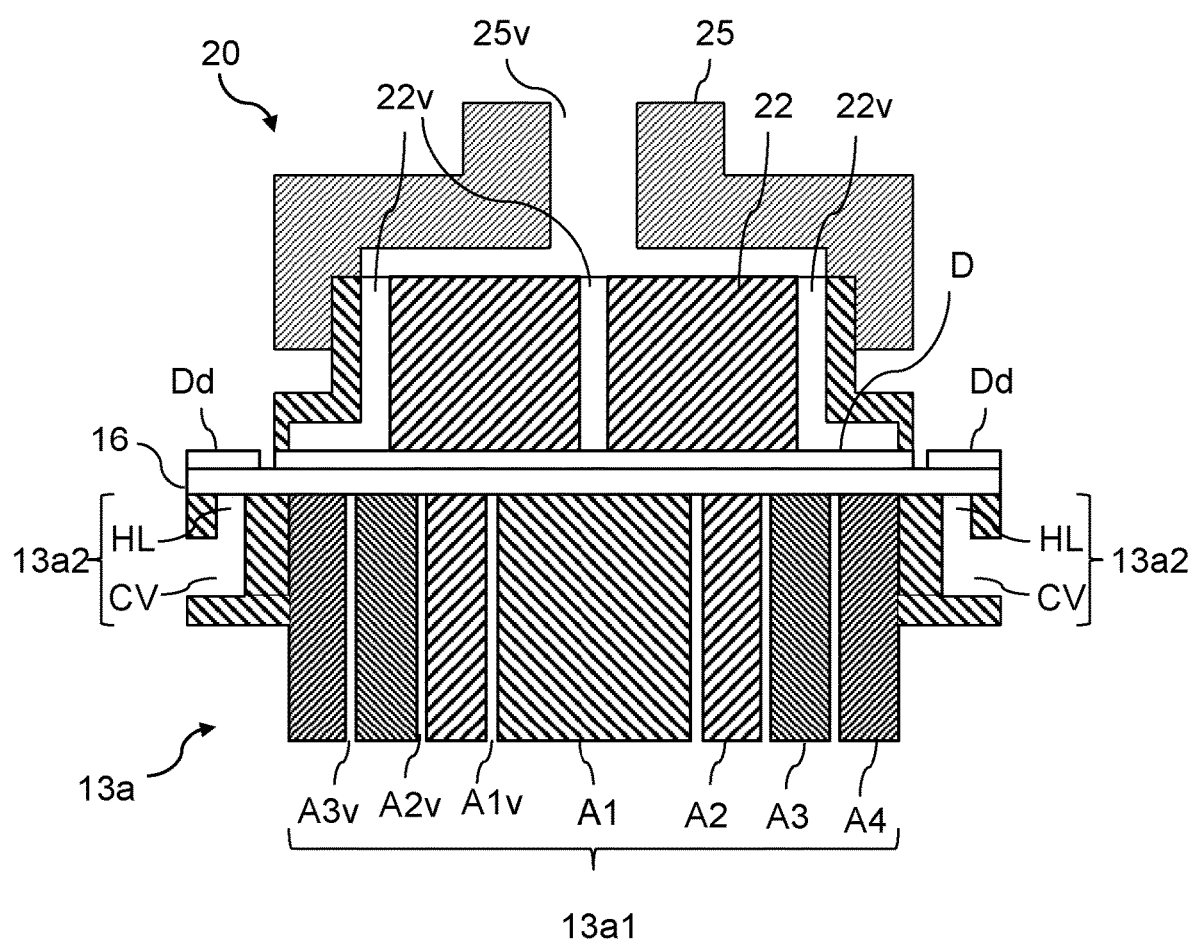
FIG. 30 is a diagram illustrating the configuration of the thrust-up unit and a collet of the pick-up head according to the example.

Next, the relation between the thrust-up unit and the collet will be described with reference to FIG. 30. FIG. 30 is a diagram illustrating the configuration of the thrust-up unit and the collet of the pick-up head according to the example.

As illustrated in FIG. 30, the collet 20 has the collet 22, a collet holder 25 holding the collet 22, suction holes 22*v* provided in the collet 22 and absorbing the die D, and a suction hole 25*v* provided in the collet holder 25 and absorbing the die D. The absorption face of the collet 22 absorbing the die has substantially the same size as the die D.

The first unit 13*a* has the dome plate 13*a*2 in the periphery of its upper face. The dome plate 13*a*2 has a plurality of absorption holes HL and a plurality of hollow portions CV, and performs suctioning from the suction hole 13*a*3 to suction a die Dd in the periphery of the die D to be picked up by the collet 22 through the dicing tape 16. FIG. 30 illustrates only one line of the absorption holes HL in the periphery of the block 13*a*1, but a plurality of lines of the absorption holes HL are provided to stabilize and hold the die Dd not to be picked up. The suctioning is performed from the suction hole 13*a*4 for dome absorption through gaps A1*v*, A2*v*, and A3*v* between the respective blocks A1 to A4 in concentric square shape and the hollow portions in the dome of the first unit 13*a*, and the die D to be picked up by the collet 22 is suctioned through the dicing tape 16. The suctioning from the suction hole 13*a*3 and the suctioning from the suction hole 13*a*4 can be performed independently.

The thrust-up unit 13 of this example is applicable to various dies by changing the shape of the block and the number of blocks of the first unit, and when the number of blocks is, for example, 6, the thrust-up unit 13 is applicable to the die having a die size of 20 mm square or less. By increasing the number of output sections of the third unit, the number of blocks in concentric circular shape of the second unit, and the number of blocks in concentric square shape of the first unit, the thrust-up unit 13 is applicable to the die having a die size above 20 mm square.

Figure 31:
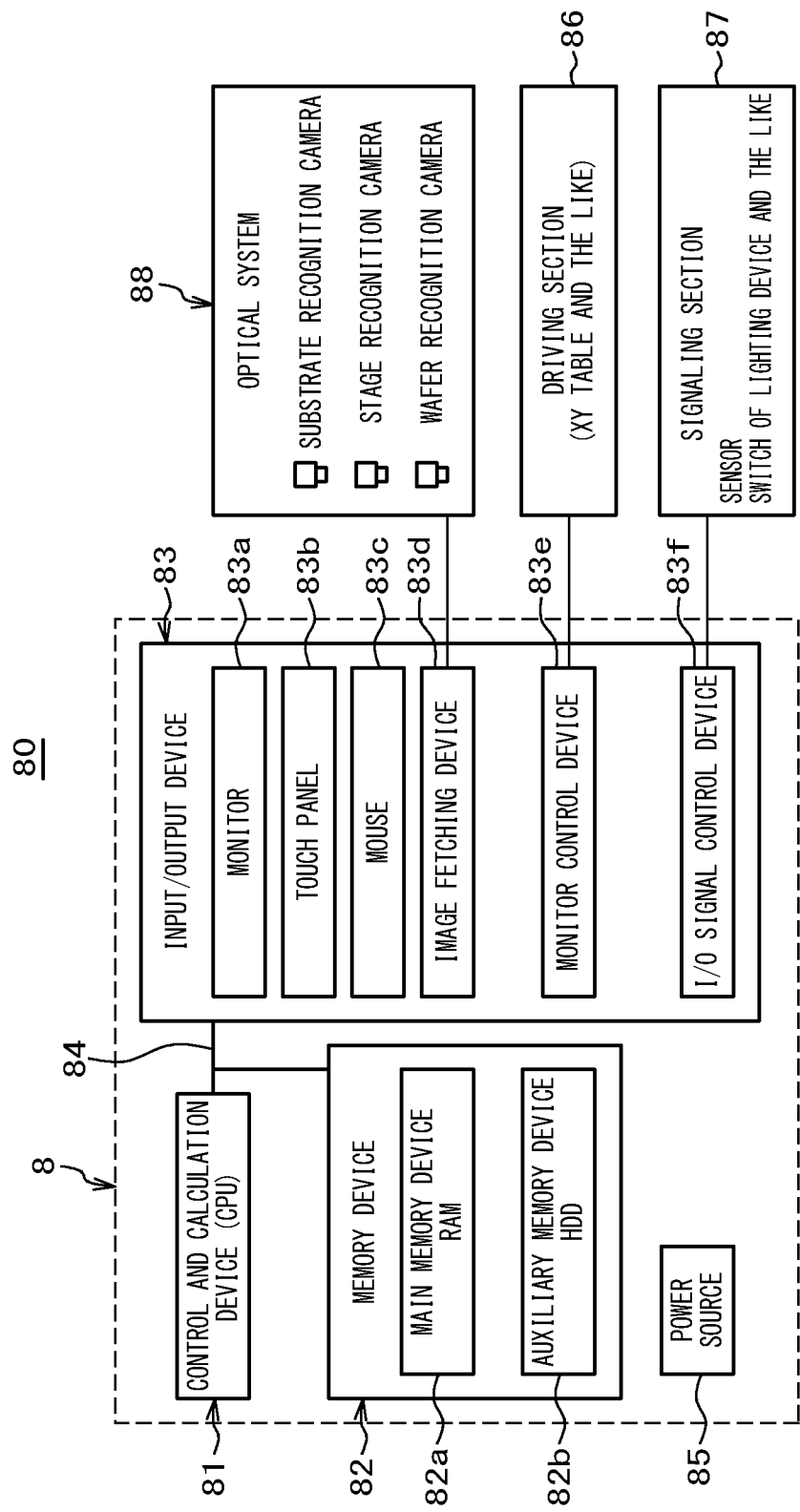
FIG. 31 is a block diagram illustrating the schematic configuration of a control system of the die bonder of FIG. 20.

Next, the control section 8 will be described with reference to FIG. 31. FIG. 31 is a block diagram illustrating the schematic configuration of a control system of the die bonder of FIG. 20. A control system 80 includes the control section 8, a driving section 86, a signaling section 87, and an optical system 88. The control section 8 is divided roughly to mainly have a control and calculation device 81 configured of a CPU (Central Processor Unit), a memory device 82, an input/output device 83, a bus line 84, and a power source 85. The control and calculation device 81 and the memory device 82 correspond to the main controller 81a of the embodiment, and a motor control device 83e corresponds to the operation controller 81b of the embodiment. The memory device 82 has a main memory device 82a configured of a RAM storing a processing program and the like, and an auxiliary memory device 82b configured of an HDD, an SSD, and the like storing control data, image data, and the like necessary for control. The input/output device 83 has the monitor 83a displaying a device state, information, and the like, the touch panel 83b inputting the instruction of the operator, a mouse 83c operating the monitor, and an image fetching device 83d fetching image data from the optical system 88. Also, the input/output device 83 has the motor control device 83e controlling the driving section 86 such as the XY table (not illustrated) of the die supplying section 1 and the ZY driving shaft of the bonding head table, and an I/O signal control device 83f fetching or controlling various sensor signals and the signal from the signaling section 87 such as the switch of a lighting device. The optical system 88 includes a wafer recognition camera 24, the stage recognition camera 32, and the substrate recognition camera 44. The control and calculation device 81 fetches necessary data through the bus line 84, calculates it, controls the pick-up head 21 and the like, and sends information to the monitor 83a and the like.

The control section 8 stores image data imaged by the wafer recognition camera 24, the stage recognition camera 32, and the substrate recognition camera 44 through the image fetching device 83d into the memory device 82. By the software programmed on the basis of the stored image data, the positioning of the die D and the package area P of the substrate S and the surface inspection of the die D and the substrate S are performed by using the control and calculation device 81. The driving section 86 is moved through the motor control device 83e by the software on the basis of the positions of the die D and the package area P of the substrate S calculated by the control and calculation device 81. By this process, the positioning of the die on the wafer is performed, and the die D is operated by the driving sections of the pick-up section 2 and the bonding section 4, and is bonded onto the package area P of the substrate S. Each of the wafer recognition camera 24, the stage recognition camera 32, and the substrate recognition camera 44 used is a grayscale, a color camera, and the like, and converts the optical intensity to a numerical value.

Figure 32:
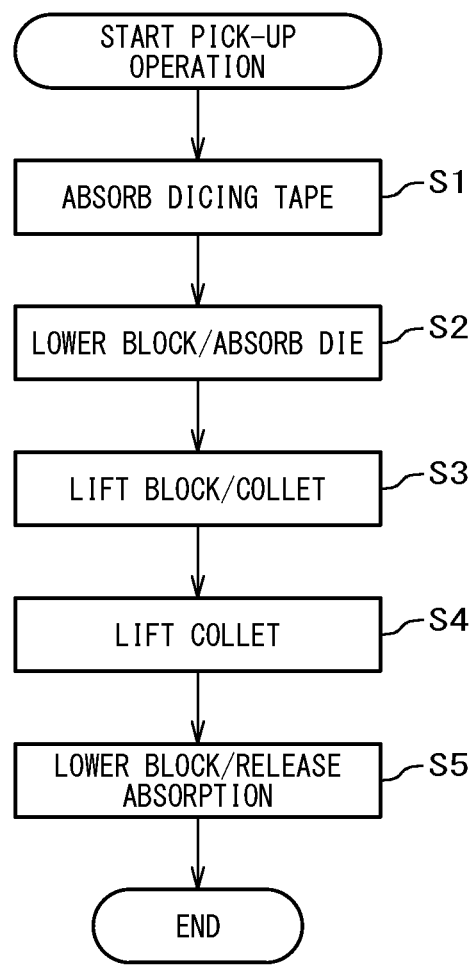
FIG. 32 is a flowchart of assistance in explaining the pick-up operation of the die bonder of FIG. 20.

Next, the pick-up operation by the thrust-up unit 13 by the above configuration will be described with reference to FIG. 32. FIG. 32 is a flowchart illustrating the processing flow of the pick-up operation.

Step S1: The control section 8 moves the wafer holding stage 12 so that the die D to be picked up is located immediately above the thrust-up unit 13, and moves the thrust-up unit 13 so that the upper face of the third unit comes into contact with the back face of the dicing tape 16. At this time, as illustrated in FIG. 30, the control section 8 allows the respective blocks A1 to A4 of the block 13a1 to form the same plane as the surface of the dome plate 13a2, and the dicing tape 16 is absorbed through the absorption holes HL of the dome plate 13a2 and the gaps A1v, A2v, and A3v between the blocks.

Step S2: The control section 8 lowers the collet 20, positions it on the die D to be picked up, and absorbs the die D through the suction holes 22v and 25v.

Step S3: The control section 8 lifts the respective blocks A1 to A4 of the block 13a1 to perform the separation operation. Here, the control section 8 performs control, on the basis of, for example, the first time chart recipe (FIG. 6) of the embodiment. That is, the control section 8 drives the plunger mechanisms P4, P3, P2, and P1 by the motors M4, M3, M2, and M1, respectively, lifts the blocks A4, A3, A2, and A1 by 200 μm through the output sections C4, C3, C2, and C1 and the blocks B4, B3, B2, and B1, respectively, and stops them. Next, the control section 8 drives the plunger mechanism P4 by the motor M4, lowers only the block A4 on the outermost side to −50 μm through the output section C4 and the block B4, and stops it. Then, the control section 8 drives the plunger mechanism P3 by the motor M3, and lowers only the block A3 on the second outermost side to −50 μm through the output section C3 and the block B3, and stops it. Then, the control section 8 drives the plunger mechanism P2 by the motor M2, lowers only the block A2 on the third outermost side to −50 μm through the output section C2 and the block B2, and stops it. Finally, the control section 8 drives the plunger mechanism P1 by the motor M1, lowers only the block A1 on the innermost side to 0 μm through the output section C1 and the block B1, and stops it.

Step S4: The control section 8 lifts the collet. In the last state of step S3, the contact area of the dicing tape 16 and the die D becomes the area that can be separated by the lifting of the collet, and the die D can be separated by the lifting of the collet 22.

Step S5: The control section 8 allows the respective blocks A1 to A4 of the block 13a1 to form the same plane as the surface of the dome plate 13a2, and the absorption of the dicing tape 16 through the absorption holes HL of the dome plate 13a2 and the gaps A1v, A2v, and A3v between the blocks is stopped. The control section 8 moves the thrust-up unit 13 so that the upper face of the first unit is separated from the back face of the dicing tape 16.

The control section 8 repeats steps S1 to S5, and picks up the good die of the wafer 11.

Figure 33:
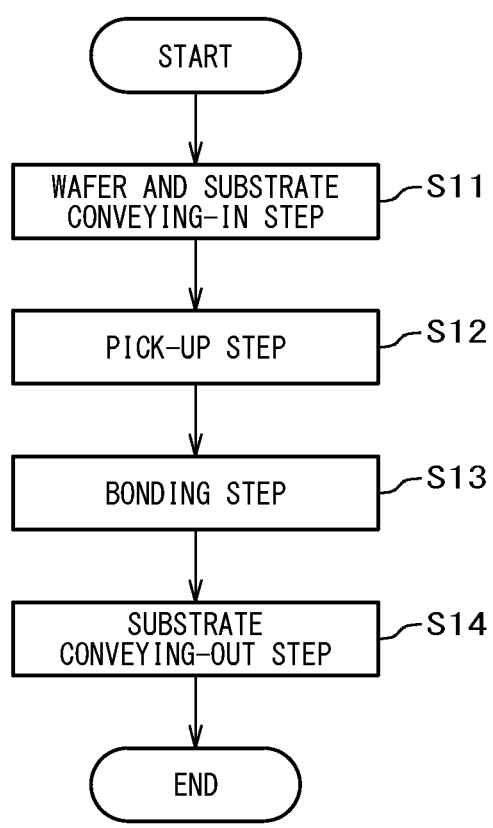
FIG. 33 is a flowchart of assistance in explaining a manufacturing method for a semiconductor device according to the example.

Next, the manufacturing method for a semiconductor device by using the die bonder according to the example will be described with reference to FIG. 33. FIG. 33 is a flowchart illustrating the manufacturing method for a semiconductor device of FIG. 20.

Step S11: The wafer ring 14 holding the dicing tape 16 to which the die D divided from the wafer 11 is stuck is stored in a wafer cassette (not illustrated), and is conveyed into the die bonder 10. The control section 8 supplies the wafer ring 14 from the wafer cassette in which the wafer ring 14 is loaded, to the die supplying section 1. Also, the substrate S is prepared, and is conveyed into the die bonder 10. The control section 8 mounts the substrate S onto the substrate conveying claws 51 by the substrate supplying section 6.

Step S12: The control section 8 separates the die D, as described above, and picks up the separated die D from the wafer 11. In this way, the die D separated from the dicing tape 16 together with the die attach film 18 is absorbed onto and held by the collet 22 to be conveyed to the next step (step S13). Then, when the collet 22 that has conveyed the die D to the next step is returned to the die supplying section 1, the next die D is separated from the dicing tape 16 according to the above procedure, and each die D is separated from the dicing tape 16 according to the same procedure hereinafter.

Step S13: The control section 8 mounts the picked-up die onto the substrate S or stacks it on the already bonded die. The control section 8 places the die D picked up from the wafer 11 onto the intermediate stage 31, picks up the die D from the intermediate stage 31 again by the bonding head 41, and bonds it onto the conveyed substrate S.

Step S14: The control section 8 takes out the substrate S on which the die D is bonded, from the substrate conveying claws 51 by the substrate conveying-out section 7. The substrate S is conveyed out from the die bonder 10.

As described above, the die D is mounted onto the substrate S through the die attach film 18, and is conveyed out from the die bonder. Thereafter, the die D is electrically connected with the electrode of the substrate S through the Au wire in the wire bonding step. Subsequently, the substrate S on which the die D is mounted is conveyed into the die bonder, and the second die D is stacked through the die attach film 18 onto the die D mounted on the substrate S, is conveyed out from the die bonder, and then, is electrically connected with the electrode of the substrate S through the Au wire in the wire bonding step. The second die D is separated from the dicing tape 16 by the above method, and then, is conveyed to the pellet bonding step, and is stacked onto the die D. After the above process is repeated a predetermined number of times, the substrate S is conveyed to the mold step, and a plurality of dies D and the Au wire are sealed by a mold resin (not illustrated), thereby completing the stack package.

As described above, in the assembling of the stack package in which the plurality of dies are mounted on the substrate in three dimensions, the thickness of the die is required to be made smaller to 20 μm or less in order to prevent the package thickness from being increased. On the other hand, since the thickness of the dicing tape is about 100 μm, the thickness of the dicing tape is four to five times the thickness of the die.

When such the thin die is separated from the dicing tape, the deformation of the die following the deformation of the dicing tape is caused more significantly, but in the die bonder of this embodiment, the damage of the die when the die is picked up from the dicing tape can be reduced.

The invention that has been made by the present inventors has been specifically described above on the basis of the embodiment and the example, but the present invention is not limited to the embodiment and the example, and needless to say, various modifications can be made.

For example, the plurality of blocks of the first unit are in concentric square shape in the above description, but may be in concentric circular shape and concentric elliptic shape, and may be configured of square blocks aligned in parallel.

Also, in the example, the example in which the die attach film is used has been described, but a preform section applying the adhesive to the substrate may be provided, and the die attach film is not necessarily required to be used.

Also, in the example, the die bonder in which the die is picked up from the die supplying section by the pick-up head to be placed onto the intermediate stage, and the die placed on the intermediate stage is bonded onto the substrate by the bonding head, has been described, but the present invention is not limited to this, and is applicable to the semiconductor manufacturing apparatus picking up the die from the die supplying section.

For example, the present invention is applicable to the die bonder not having the intermediate stage and the pick-up head and bonding the die in the die supplying section onto the substrate by the bonding head.

Also, the present invention is applicable to a flip chip bonder not having the intermediate stage, picking up the die from the die supplying section, rotating the die pick-up head upward, transferring it to the bonding head, and bonding it onto the substrate by the bonding head.

Also, the present invention is applicable to a die sorter not having the intermediate stage and the bonding head and placing the die picked up from the die supplying section by the pick-up head onto a tray and the like.

What is claimed is:

1. A manufacturing method for manufacturing a semiconductor device in a semiconductor manufacturing apparatus that includes a thrust-up unit, having a plurality of blocks in contact with a dicing tape and being capable of operating independently and thrusting up a die from a lower side of the dicing tape, a collet absorbing the die, a detector including a sensor for detecting the position of the thrusting unit, a sensor for detecting pressure and a sensor for detecting a gas flow rate of the collet, and a controller configured to control operation of the plurality of blocks based on a time chart recipe capable of setting a height and a speed of the plurality of blocks in each step, the method comprising:
   (a) a step of conveying a wafer ring holding a dicing tape into the semiconductor manufacturing apparatus; and
   (b) a step of thrusting up the die by the thrust-up unit and picking up the die by the collet,
   wherein the (b) step includes (b1) a step of lifting or lowering the plurality of blocks based on the time chart recipe set by a graphical user interface, and
   the (b1) step includes detecting the gas flow rate during one thrust-up sequence, rewriting the time chart recipe in real time based on the detected gas flow rate, changing the operation within the one thrust-up sequence based on the rewritten time chart recipe and continuing driving each of the blocks.

2. The manufacturing method according to claim 1, wherein when all of the plurality of blocks are lifted in the first step of the plurality of steps, the (b) step continues the lifting of all of the plurality of blocks when the detector detects a leak in a vacuum system of the correct when an outermost block of the plurality of blocks is lifted, and when the leak is a predetermined value or less.

3. The manufacturing method according to claim 1,
   wherein the time chart recipe is a first time chart recipe that is capable of setting a time of the step, and
   wherein in the (b1) step, each step is completed based on the time of the first time chart recipe.

4. The manufacturing method according to claim 3, wherein the first time chart recipe is capable of setting an acceleration of each block.

5. The manufacturing method according to claim 4,
   wherein the time chart recipe is a fifth time chart recipe that inputs a function that calculates the time of the step, the speed, the acceleration, and the height of the block, and
   in the (b1) step, the plurality of blocks are lifted or lowered based on the calculation result of the function of the fifth time chart recipe.

6. The manufacturing method according to claim 3,
wherein the time chart recipe is a third time chart recipe that is capable of setting an acceleration of each block and a waiting time after completion of the lifting or lowering for synchronization of each block, and in the step (b1), each step is completed with priority given to each block reaching a designated position, and the next step is started after the waiting time of the third time chart recipe.

7. The manufacturing method according to claim 1,
wherein the time chart recipe is a second time chart recipe that is capable of setting a time difference from completion of the lifting or lowering of each block to a start time of a next step, and wherein in the (b1) step, each step is completed with priority given to each block reaching a designated position, and the next step is started after the time difference of the second time chart recipe.

8. The manufacturing method according to claim 7,
wherein the time chart recipe is a fourth time chart recipe that is capable of setting a reference time that is a reference of the time difference, and in the (b1) step, each step is completed with priority given to each block reaching a designated position, and the next step is started after the time difference from the reference time of the fourth time chart recipe.

9. The manufacturing method according to claim 1, wherein in the (b1) step, the plurality of blocks are independently operated by a plurality of driving shafts provided corresponding to the plurality of blocks.

10. The manufacturing method according to claim 1, further comprising:
(c) a step of bonding the die picked-up onto a substrate or an already bonded die.

11. The manufacturing method according to claim 1,
wherein the (b1) step includes lifting all upper surfaces of the plurality of blocks from an initial position to a first predetermined height, and then lifting upper surfaces of inner blocks other than a first block arranged on outermost side of the plurality of blocks from the first predetermined height to a second predetermined height.

12. The manufacturing method according to claim 11,
wherein the (b1) step further includes, before lifting the upper surfaces of the inner blocks from the first predetermined height to the second predetermined height, lowering an upper surface of the first block from the first predetermined height.

13. The manufacturing method according to claim 12,
wherein the (b1) step further includes sucking the dicing tape and landing the collet on the die to suck the die by the collet, while all of the plurality of blocks are in the initial position.

14. The manufacturing method according to claim 13,
wherein the (b1) step further includes lowering the upper surfaces of the plurality of blocks other than a block arranged on an innermost side from the second predetermined height, and then lifting the collet.

15. The manufacturing method according to claim 13,
wherein the (b1) step further includes lifting the collet, and then moving all of the upper surfaces of the plurality of blocks to the initial position.

16. The manufacturing method according to claim 11,
wherein the (b1) step further includes sucking the dicing tape and landing the collet on the die to suck the die by the collet, while all of the plurality of blocks are in the initial position.

17. The manufacturing method according to claim 16,
wherein the (b1) step further includes lowering the upper surfaces of the plurality of blocks other than a block arranged on an innermost side from the second predetermined height, and then lifting the collet.

18. The manufacturing method according to claim 16,
wherein the (b1) step further includes lifting the collet, and then moving all of the upper surfaces of the plurality of blocks to the initial position.

* * * * *